(12) United States Patent
Hsieh et al.

(10) Patent No.: US 12,154,933 B2
(45) Date of Patent: Nov. 26, 2024

(54) IMAGE SENSORS WITH STRESS ADJUSTING LAYERS

(71) Applicant: Taiwan Semiconductor Manufacturing Co., Ltd., Hsinchu (TW)

(72) Inventors: Feng-Chien Hsieh, Pingtung (TW); Kuo-Cheng Lee, Tainan (TW); Ying-Hao Chen, Tainan (TW); Yun-Wei Cheng, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 201 days.

(21) Appl. No.: 17/816,000

(22) Filed: Jul. 29, 2022

(65) Prior Publication Data
US 2022/0384497 A1 Dec. 1, 2022

Related U.S. Application Data

(62) Division of application No. 16/937,306, filed on Jul. 23, 2020, now Pat. No. 11,769,780.
(Continued)

(51) Int. Cl.
*H01L 27/146* (2006.01)
(52) U.S. Cl.
CPC .... *H01L 27/1464* (2013.01); *H01L 27/14621* (2013.01); *H01L 27/14636* (2013.01); *H01L 27/14683* (2013.01); *H01L 27/14685* (2013.01)
(58) Field of Classification Search
CPC ........... H01L 27/1464; H01L 27/14621; H01L 27/14636; H01L 27/14685; H01L 27/14683
See application file for complete search history.

(56) References Cited

U.S. PATENT DOCUMENTS 5,734,194 A 3/1998 Sanders et al.
6,858,460 B2 * 2/2005 Rhodes ............ H01L 27/14601
438/75
(Continued)

FOREIGN PATENT DOCUMENTS

JP H06132277 A 5/1994
TW 201543659 A 11/2015

OTHER PUBLICATIONS

Nicotra et al., "Evaluation of the excess and clustered silicon profiles in a silicon implanted SiO2 layer." Nuclear Instruments and Methods in Physics Research Section B: Beam Interactions with Materials and Atoms, Apr. 2007, vol. 257, No. 1-2, pp. 104-107.

*Primary Examiner* — Mounir S Amer
*Assistant Examiner* — Alexander Belousov
(74) *Attorney, Agent, or Firm* — Sterne, Kessler, Goldstein & Fox P.L.L.C.

(57) ABSTRACT

An image sensor with stress adjusting layers and a method of fabrication the image sensor are disclosed. The image sensor includes a substrate with a front side surface and a back side surface opposite to the front side surface, an anti-reflective coating (ARC) layer disposed on the back side surface of the substrate, a dielectric layer disposed on the ARC layer, a metal layer disposed on the dielectric layer, and a stress adjusting layer disposed on the metal layer. The stress adjusting layer includes a silicon-rich oxide layer. The concentration profiles of silicon and oxygen atoms in the stress adjusting layer are non-overlapping and different from each other. The image sensor further includes oxide grid structure disposed on the stress adjusting layer.

20 Claims, 43 Drawing Sheets

Related U.S. Application Data

(60) Provisional application No. 62/981,752, filed on Feb. 26, 2020.

(56) References Cited

U.S. PATENT DOCUMENTS

| | | | | |
|---|---|---|---|---|
| 7,233,029 | B2* | 6/2007 | Mochizuki | G02B 5/0825 |
| | | | | 257/98 |
| 7,385,167 | B2* | 6/2008 | Li | H01L 27/14643 |
| | | | | 257/435 |
| 7,763,499 | B2* | 7/2010 | Li | H01L 27/14643 |
| | | | | 257/E21.585 |
| 8,053,856 | B1* | 11/2011 | Tu | H01L 27/1464 |
| | | | | 257/431 |
| 8,354,295 | B2* | 1/2013 | Tu | H01L 27/1463 |
| | | | | 438/57 |
| 9,252,296 | B2 | 2/2016 | Tsao et al. | |
| 10,510,871 | B1 | 12/2019 | More et al. | |
| 11,264,414 | B2* | 3/2022 | Ishii | H01L 27/14625 |
| 2003/0118066 | A1* | 6/2003 | Bour | H01S 5/0421 |
| | | | | 372/45.01 |
| 2004/0219698 | A1* | 11/2004 | Mochizuki | H01L 27/14627 |
| | | | | 438/22 |
| 2006/0011808 | A1* | 1/2006 | Li | H01L 27/14623 |
| | | | | 257/E31.122 |
| 2006/0097134 | A1* | 5/2006 | Rhodes | H01L 27/14685 |
| | | | | 250/214.1 |
| 2008/0230861 | A1* | 9/2008 | Li | H01L 27/14685 |
| | | | | 438/57 |
| 2011/0250715 | A1 | 10/2011 | Adkisson et al. | |
| 2012/0034730 | A1* | 2/2012 | Tu | H01L 27/1463 |
| | | | | 257/E31.127 |
| 2012/0038014 | A1 | 2/2012 | Tai et al. | |
| 2012/0119241 | A1* | 5/2012 | Panaccione | H01L 33/58 |
| | | | | 257/98 |
| 2012/0280348 | A1* | 11/2012 | Chou | H01L 27/1464 |
| | | | | 257/435 |
| 2013/0241018 | A1* | 9/2013 | JangJian | H01L 27/14627 |
| | | | | 257/E31.127 |
| 2013/0327921 | A1* | 12/2013 | Chen | H01L 21/0334 |
| | | | | 257/E31.127 |
| 2014/0175473 | A1* | 6/2014 | Donofrio | H01L 33/44 |
| | | | | 438/26 |
| 2014/0211057 | A1 | 7/2014 | Chien et al. | |
| 2015/0145096 | A1* | 5/2015 | Hsu | H01L 27/14689 |
| | | | | 438/73 |
| 2015/0243694 | A1 | 8/2015 | Ihara | |
| 2016/0300871 | A1 | 10/2016 | Borthakur et al. | |
| 2017/0250211 | A1 | 8/2017 | Chang et al. | |
| 2017/0317134 | A1* | 11/2017 | Lu | H01L 27/1462 |
| 2018/0269252 | A1* | 9/2018 | Qi | H01L 27/14636 |
| 2019/0067345 | A1 | 2/2019 | Qi et al. | |
| 2020/0185443 | A1* | 6/2020 | Itabasi | H01L 27/14685 |
| 2020/0227452 | A1* | 7/2020 | Ishii | H01L 27/14612 |
| 2021/0265399 | A1* | 8/2021 | Hsieh | H01L 27/14685 |
| 2022/0384497 | A1* | 12/2022 | Hsieh | H01L 27/14683 |

* cited by examiner

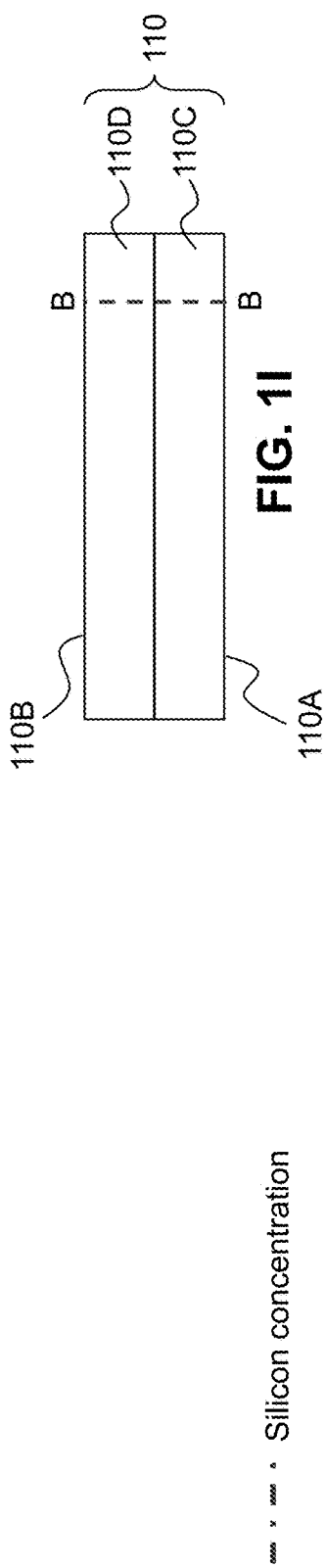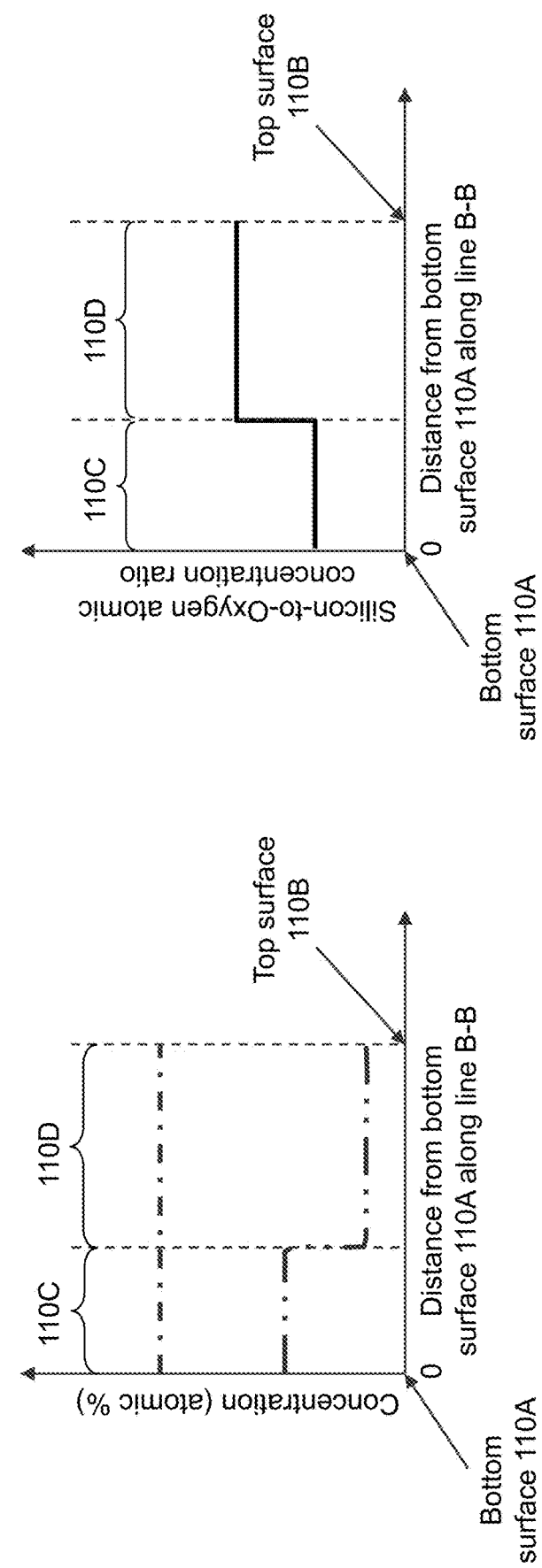

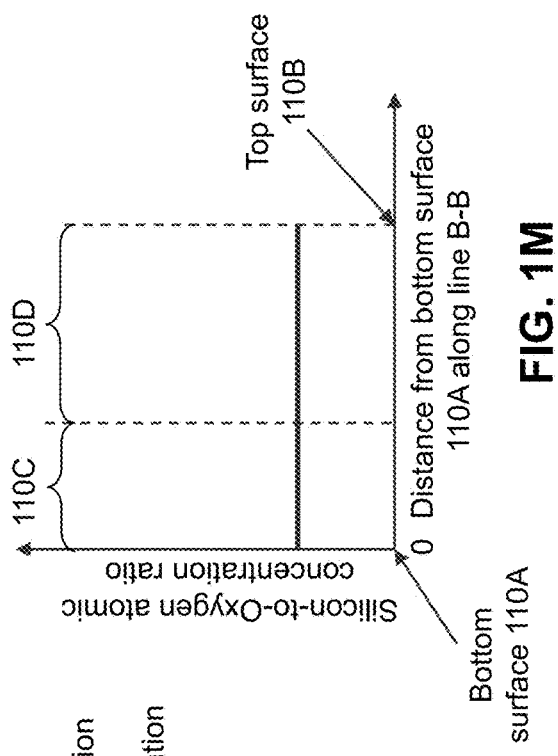
FIG. 1M
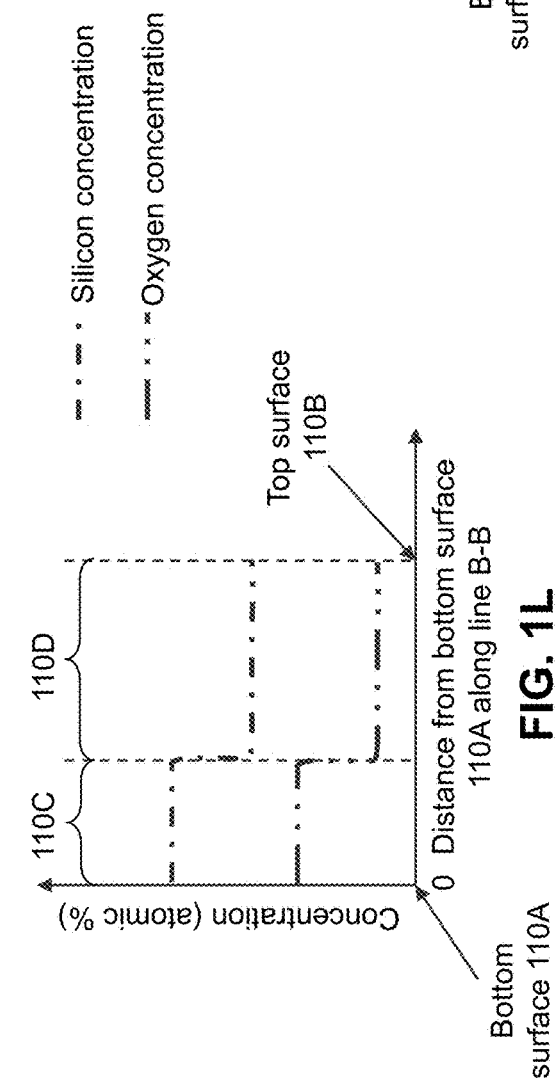
FIG. 1L
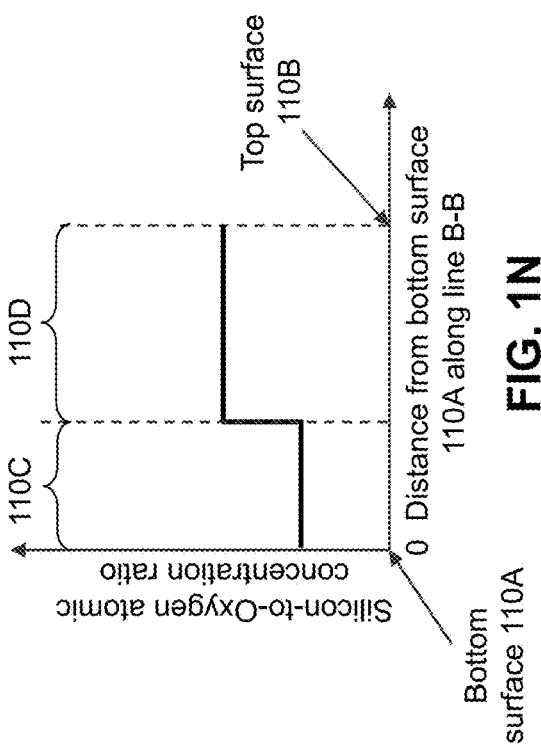
FIG. 1O
FIG. 1N

IMAGE SENSORS WITH STRESS ADJUSTING LAYERS

CROSS-REFERENCE TO RELATED APPLICATIONS

This application is a divisional of U.S. patent application Ser. No. 16/937,306, titled "Image Sensors with Stress Adjusting Layers," filed Jul. 23, 2020, which claims the benefit of U.S. Provisional Patent Application No. 62/981,752, titled "Stress Adjusting Layers in Back Side Illuminated Image Sensors," filed Feb. 26, 2020, each of which is incorporated by reference herein in its entirety.

BACKGROUND

Semiconductor image sensors are used to sense incoming visible or non-visible radiation, such as visible light, infrared light, etc. Complementary metal-oxide-semiconductor (CMOS) image sensors (CIS) and charge-coupled device (CCD) sensors are used in various applications, such as digital still cameras, mobile phones, tablets, goggles, etc. These image sensors utilize an array of pixels that absorb (e.g., sense) the incoming radiation and convert it into electrical signals. An example of an image sensor is a backside illuminated (BSI) image sensor, which detects radiation from a "backside" of a substrate of the BSI image sensor.

BRIEF DESCRIPTION OF THE DRAWINGS

Aspects of this disclosure are best understood from the following detailed description when read with the accompanying figures.

FIG. 1I illustrates a cross-sectional view of a stress adjusting bi-layer structure in a BSI image sensor, in accordance with some embodiments.

FIGS. 1J-1O illustrate characteristics of a stress adjusting bi-layer structure in a BSI image sensor, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
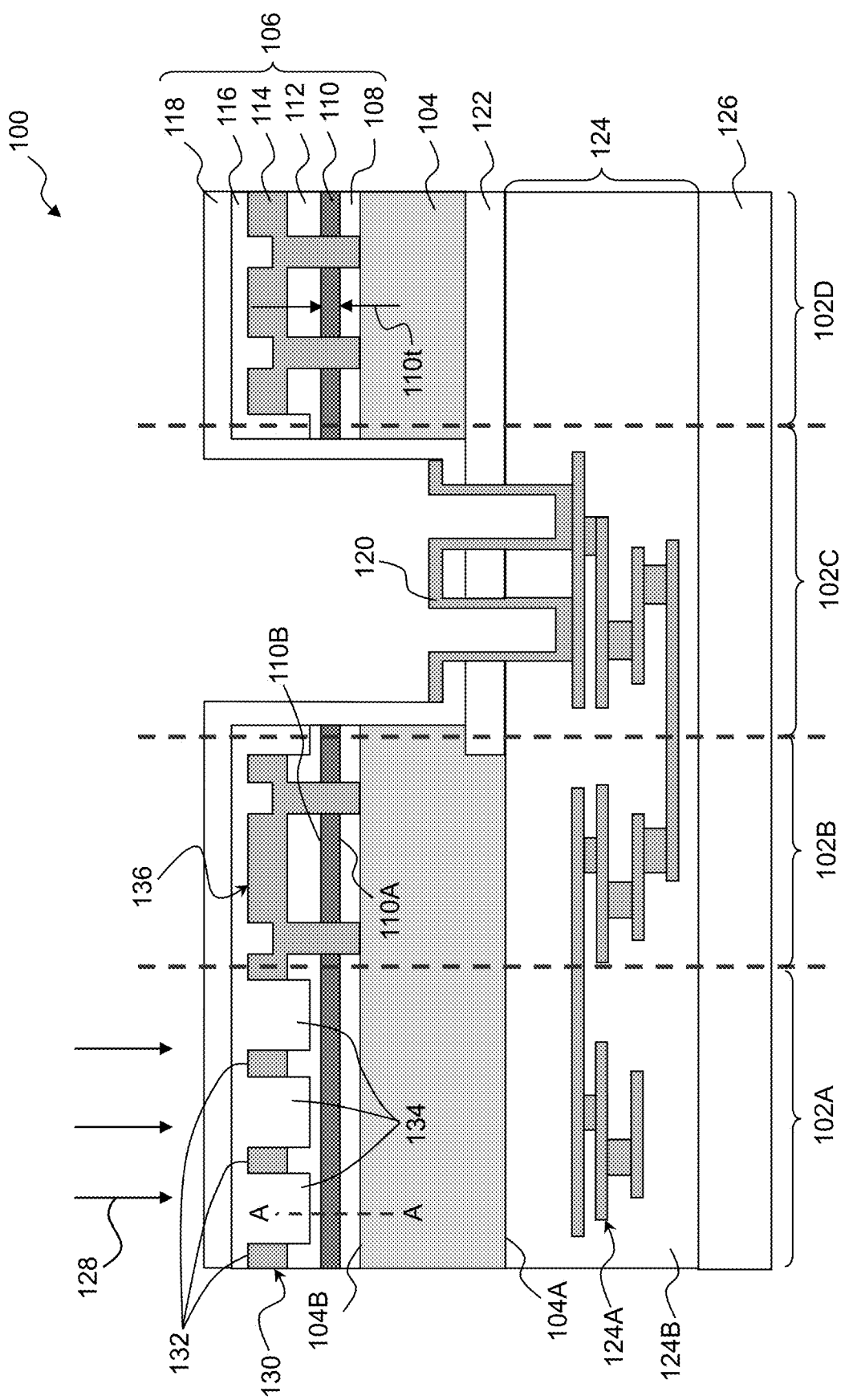
FIG. 1A illustrates a cross-sectional view of a BSI image sensor with a stress adjusting layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a low dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "conductive" refers to an electrically conductive structure, layer, and/or region.

As used herein, the term "silicon-rich oxide" refers to a non-stoichiometric silicon oxide ($SiO_x$) material that has a ratio of silicon-to-oxygen greater than the stoichiometric silicon-to-oxygen ratio of about 1:2.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

A BSI image sensor device includes a pixel region with an array of pixels or radiation-sensing regions formed on a substrate (e.g., a semiconductor substrate). The terms "radiation-sensing regions" and "pixels" may be used interchangeably throughout this disclosure. The pixels are configured to convert photons from the incident radiation to electrical signal. The electrical signal is subsequently distributed to processing components attached to the BSI image sensor. For this reason, the pixel region overlies a multilevel metallization layer configured to distribute the electrical signal generated within the pixels to appropriate processing components. The multilevel metallization layer is formed on a first surface of the substrate referred to as the "front side" surface of the substrate. The pixel region is formed on a second surface of the substrate that is opposite to the front side surface of the substrate. This second surface of the substrate is referred to herein as the "backside" surface of the substrate. The pixel region includes a grid structure that provide optical isolation between adjacent pixels. Further, the pixel region includes color filtering layers. The material of color filtering layers can be selected such that light with a desired wavelength passes through the color filtering layers, while light with other wavelengths is absorbed by the color filtering layers.

The components of the BSI image sensor (e.g., pixels, transistors, capacitors, memory structures, or other chips attached to the BSI image senor) can be electrically coupled to external devices (e.g., an external circuitry) through wire connectors attached to pad structures formed on the back side surface of the substrate. To achieve this, the pad structures of the BSI image sensor extends from the back side surface of the substrate to the front side surface of the substrate and electrically connect to the multilevel metallization layer of the BSI image sensor. Accordingly, the multilevel metallization layer, which provides electrical signal connection to the BSI image sensor can be electrically connected to an external device or circuit through the pad structures. The pad structures can be disposed at the periphery of the BSI image sensor around the pixel region.

A challenge with BSI image sensors is achieving high device reliability. The device reliability of BSI image sensors is negatively impacted by the build up of residual stress within the stack of layers forming the pixel region on the back side surface of the substrate. The residual stress build-up is due to the lattice mismatch between the different layers in the stack of layers. Such build up of residual stress can develop cracks within the stack of layer and/or can cause the stack of layers to peel off from the substrate, resulting in device failure.

The present disclosure provides example BSI image sensors with stress adjusting layers and example methods for fabricating the same. The stress adjusting layers are disposed within the stack of layers in the pixel region and/or other regions (e.g., contact pad region, metal shield region, etc.) of the BSI image sensors. The stress adjusting layers are arranged to induce stress to counteract the residual stress within the stack of layers. For example, the stress adjusting layers induce compressive stress to counteract tensile stress in the underlying and/or overlying layers or induce tensile stress to counteract compressive stress in the underlying and/or overlying layers. Such counteracting stress induced by the stress adjusting layers relaxes the residual stress within the stack of layers, thus preventing the formation of stress induced cracks within the stack of layers and/or the stress induced peeling of layers from the substrate. The use of the stress adjusting layers in the BSI image sensors can increase device reliability by about 40% to about 50% compared to BSI image sensors without the stress adjusting layers.

In some embodiments, the stress adjusting layers can be disposed above and/or below the grid structure in the pixel regions. The stress adjusting layers can be disposed on an anti-reflective coating (ARC) layer below the grid structure and/or interposed between the color filtering layers above the grid structure. In some embodiments, the stress adjusting layers can include a silicon-rich oxide layer with a linear or graded Si concentration profile and a constant or graded silicon-to-oxygen ratio across the silicon-rich oxide layer. As used herein, the term "silicon-rich oxide" refers to a non-stoichiometric silicon oxide ($SiO_x$) material that has a ratio of silicon-to-oxygen greater than the stoichiometric silicon-to-oxygen ratio of about 1:2. In some embodiments, the stress adjusting layers can include a bi-layer structure with a silicon-rich oxide bottom layer and an oxide or nitride top layer. The bi-layer structure can include a constant, or graded Si concentration profile and a constant or graded silicon-to-oxygen ratio across the bi-layer structure. Other shapes of Si concentration profiles across the bi-layer structure are within the scope of the present disclosure. Besides the bi-layer structure, other layer configurations of the stress adjusting layer are within the scope of the present disclosure.

In some embodiments, the stress adjusting layers include a strained layer with a tensile or compressive stress induced within the strained layer. The strained layer can include a strained silicon-rich oxide layer. In some embodiments, the strained layer can include a bi-layer structure with a strained silicon-rich oxide bottom layer and an oxide or nitride top layer. The strained silicon-rich oxide layer can include a linear or graded Si concentration profile and a constant or graded silicon-to-oxygen ratio across the strained silicon-rich oxide layer. The stress level within the stress adjusting layers can be tuned during the deposition process by varying the deposition parameters, such as precursor gas flow rate, precursor gas pressure, deposition temperature, deposition rate, layer thickness, and material composition.

FIG. 1A illustrates a cross-sectional view of a BSI image sensor 100 with a pixel region 102A, a periphery region 102B, a contact pad region 102C, and a back side scribe line (BSL) region 102D, according to some embodiments.

BSI image sensor 100 can be formed on a substrate 104 with a front side surface 104A and a back side surface 102B. Substrate 106 can be a semiconductor material, such as silicon (Si), germanium (Ge), silicon germanium (SiGe), silicon carbide (SiC), indium phosphide (InP), gallium arsenide (GaAs), and a combination thereof. In some embodiments, substrate 106 can include a silicon-on-insulator (SOI) structure or a germanium-on-insulator (GOI) structure. Other suitable materials for substrate 106 are within the scope of the present disclosure.

BSI image sensor 100 can include a stack of layers 106 disposed on back side surface 104B, a shallow trench isolation region 120 disposed within substrate 104, a multi-level metallization layer 124 disposed on front side surface 104A, a pad structure 120 disposed within contact pad region 102C, and a carrier substrate 126. Pad structure 120 is an input/output (I/O) port of BSI image sensor 100 and includes a conductive layer that is electrically coupled to a multi-level interconnect structure 124A embedded in an inter-metal dielectric (IMD) layer 124B. BSI image sensor 100 can include additional components, such as microlenses on stack of layers 106, solder bump on pad structure 120, metal wirings, active and/or passive devices, insulating layers, etch stop layers, and doped regions that are not shown for simplicity.

Pixel region 102A can include a metal grid structure 130 with grid lines 132 that isolates pixels 134 from each other and is configured to receive incident radiation beams 128, which are converted to an electrical signal through stack of layers 106 in pixel region 102A. The electrical signal is distributed by pad structure 120 and multi-level metallization layer 124 to carrier substrate 126 or an external circuit. Carrier substrate 126 can be bonded to multi-level metallization layer 124 by molecular forces—a technique known as direct bonding or optical fusion bonding—or by other bonding techniques known in the art, such as metal diffusion or anodic bonding. In some embodiments, carrier substrate 126 can include materials similar to substrate 104 or can include a glass substrate. In some embodiments, carrier substrate 126 can include an application specific integrated circuit (ASIC). The ASIC can include active devices (e.g., transistor structures) to form logic and memory circuits in the ASIC. Electrical connections between active devices and stack of layers 106 are provided by multi-level metallization layer 124.

Periphery region 102B can include grounded metal shield 136 that provide optical shielding to active devices (not shown) in periphery region 102B to keep the active devices optically dark. The active devices in periphery region 102B can be reference pixels that are used to establish a baseline of an intensity of light for BSI image sensor 100. Contact pad region 102C can include one or more conductive bonding pads or solder bumps (not shown) on pad structure 120 through which electrical connections between BSI image sensor 100 and external circuit can be established. BSL region 102D can isolate BSI image sensor 100 from adjacent semiconductor devices (not illustrated) and can be cut to separate adjacent semiconductor devices on adjacent dies before the dies are packaged and sold as integrated circuit chips.

Stack of layers 106 can include an ARC layer 108 disposed on back side surface 104B, a stress adjusting layer 110 disposed on ARC layer 108, a first dielectric layer 112 disposed on stress adjusting layer 110, a metal layer 114 disposed on first dielectric layer 112, a second dielectric layer 116 disposed on metal layer 114, and a third dielectric layer 118 disposed on second dielectric layer 116. In some embodiments, ARC layer 108 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$) or other suitable high-k dielectric materials. First dielectric layer 112 can include a plasma-enhanced oxide (PEOX) layer formed using plasma enhanced CVD process with a tetraethyl oxysilane (PE-TEOS) precursor. In some embodiments, metal layer 114 can include aluminum (Al), copper (Cu), tantalum (Ta), titanium (Ti), a combination thereof, or other suitable metallic materials. Second dielectric layer 116 can include an oxide layer, an oxynitride layer, or other suitable materials with color filtering properties and third dielectric layer 118 can include a buffer oxide layer or a buffer nitride layer.

In some embodiments, stress adjusting layer 110 can be interposed between ARC layer 108 and first dielectric layer 112 to prevent the formation of residual stress between ARC layer 108 and first dielectric layer 112. The residual stress can be due to lattice mismatch between ARC layer 108 and first dielectric layer 112 and/or due to deposition process-related stress induced in ARC layer 108 and/or first dielectric layer 112. Without the use of stress adjusting layer 110, such residual stress can lead to the formation of cracks within ARC layer 108 and/or first dielectric layer 112 and/or can cause ARC layer 108 to peel off from back side surface 104B of substrate 104, resulting in device failure.

Stress adjusting layer 110 can be formed with a structure and/or composition that can induce stress to counteract the residual stress within ARC layer 108 and/or first dielectric layer 112. For example, stress adjusting layer 110 can be formed with a structure and/or composition that induces compressive stress to counteract tensile residual stress in ARC layer 108 and/or first dielectric layer 112 or induces tensile stress to counteract compressive residual stress in ARC layer 108 and/or first dielectric layer 112. Such counteracting stress induced by stress adjusting layer 110 can relax the residual stress within ARC layer 108 and/or first dielectric layer 112. Relaxing the residual stress can prevent the formation of stress induced cracks within ARC layer 108 and/or first dielectric layer 112 and/or prevent the stress induced peeling of ARC layer 108 from substrate 104.

In some embodiments, stress adjusting layer 110 can include a strained layer with a tensile or compressive stress induced within the strained layer, in which atoms are stretched beyond their normal interatomic distance. In some embodiments, stress adjusting layer 110 can have a thickness 110t ranging from about 10 nm to about 500 nm. Thickness 110t outside the range of about 10 nm to about 500 nm may not induce an adequate level of stress in ARC layer 108 and/or first dielectric layer 112 to counteract the residual stress within ARC layer 108 and/or first dielectric layer 112. Stress adjusting layer 110 is formed with a refractive index ranging from about 1.5 to about 2.7. If stress adjusting layer 110 is formed with a refractive index outside the range of about 1.5 and about 2.7, the optical efficiency of pixel region 102A degrades, consequently degrading the sensor performance of BSI image sensor 100.

In some embodiments, stress adjusting layer 110 can include a silicon-rich oxide layer with a silicon concentration ranging from about 45 atomic % to about 65 atomic % to achieve an adequate level of stress in stress adjusting layer 110 to counteract the residual stress within ARC layer 108 and/or first dielectric layer 112. As used herein, the term "silicon-rich oxide" refers to a non-stoichiometric silicon oxide ($SiO_x$) material that has a ratio of silicon-to-oxygen greater than the stoichiometric silicon-to-oxygen ratio of about 1:2. If silicon concentration in stress adjusting layer 110 is outside the range of about 45 atomic % to about 65 atomic %, stress adjusting layer 110 is ineffective in relaxing the residual stress within ARC layer 108 and/or first dielectric layer 112, and thus ineffective in preventing the formation of cracks within ARC layer 108 and/or first dielectric layer 112 and/or preventing ARC layer 108 from peeling off substrate 104.

Figure 1C:
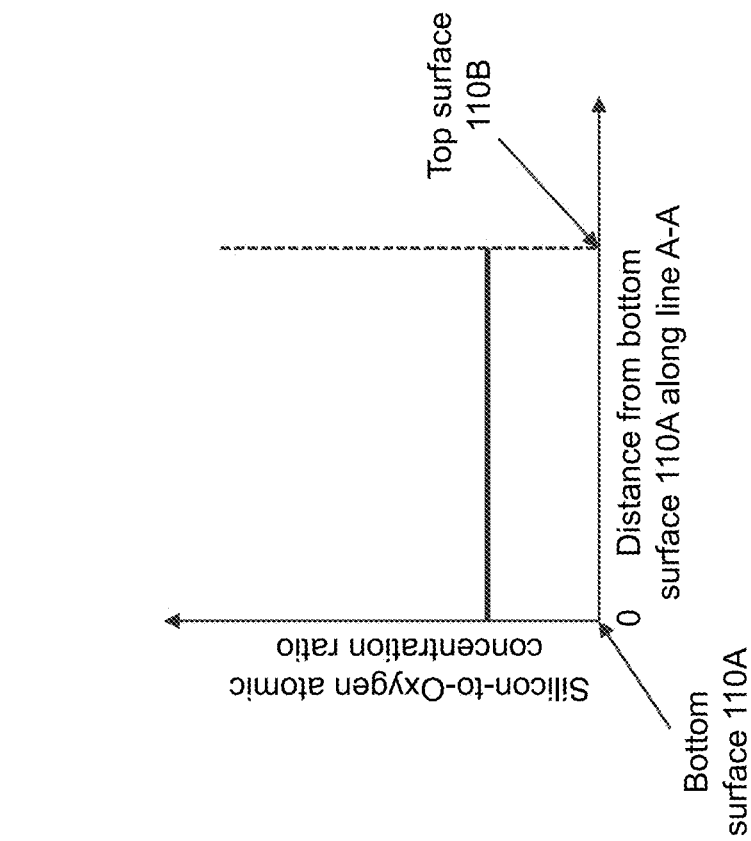
FIGS. 1B-1H illustrate characteristics of a stress adjusting layer in a BSI image sensor, in accordance with some embodiments.
Figure 1B:
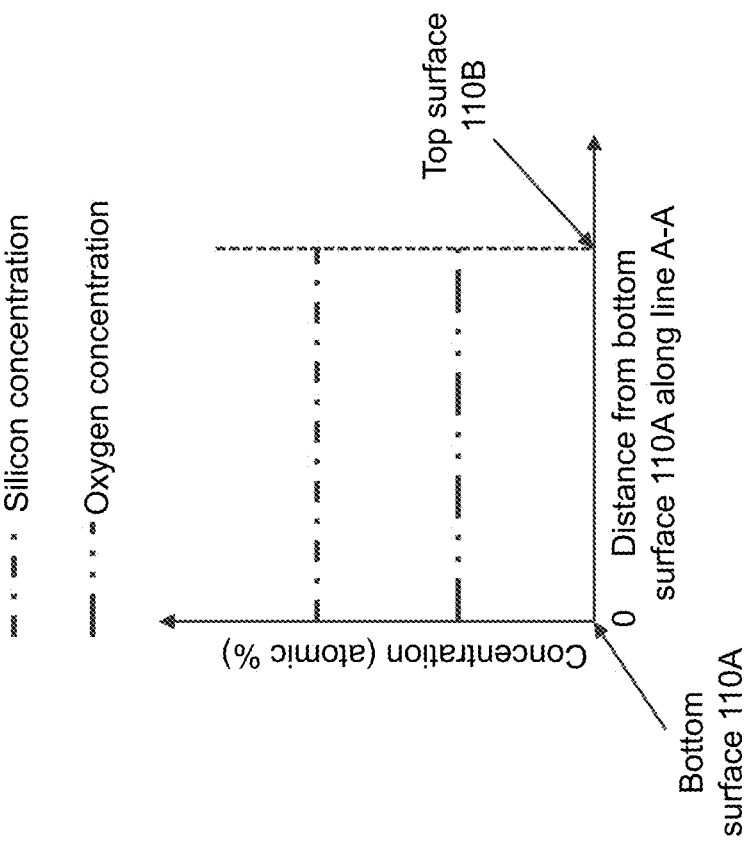

In some embodiments, for effective removal of the residual stress from ARC layer 108 and/or first dielectric layer 112, stress adjusting layer 110 can have a silicon-to-oxygen atomic concentration ratio ("Si:O ratio") ranging from about 28:15 to about 28:31. In some embodiments, the atomic concentration profiles of silicon and oxygen in stress adjusting layer 110 along line A-A of FIG. 1A can have a linear profile with a silicon atomic concentration higher than an oxygen atomic concentration, as shown in FIG. 1B. Stress adjusting layer 110 with such linear atomic concentration profiles can have a constant Si:O ratio as shown in FIG. 1C.

Figure 1E:
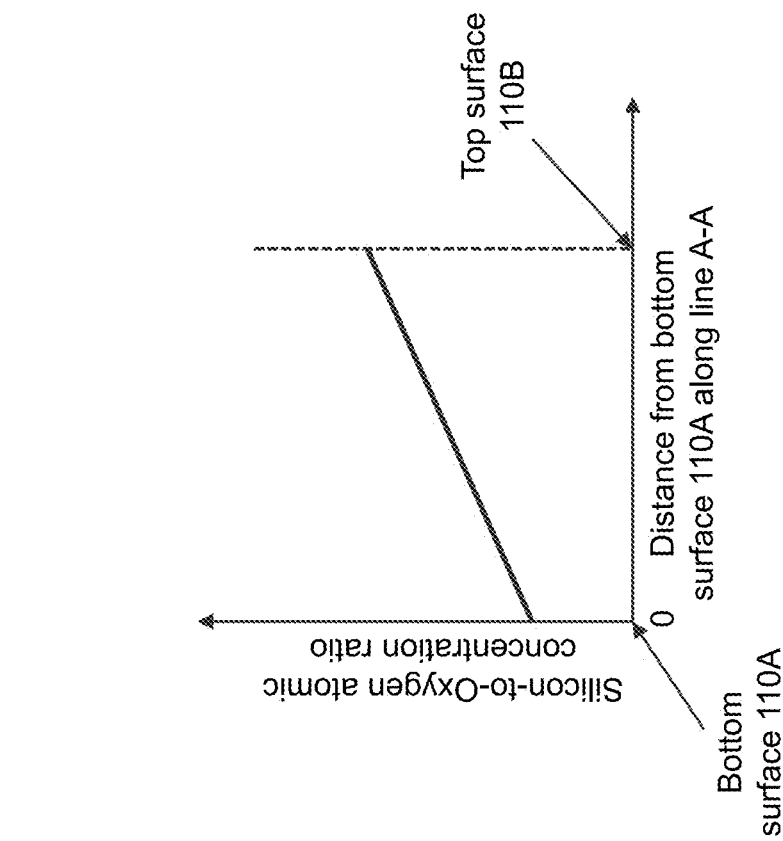
Figure 1D:
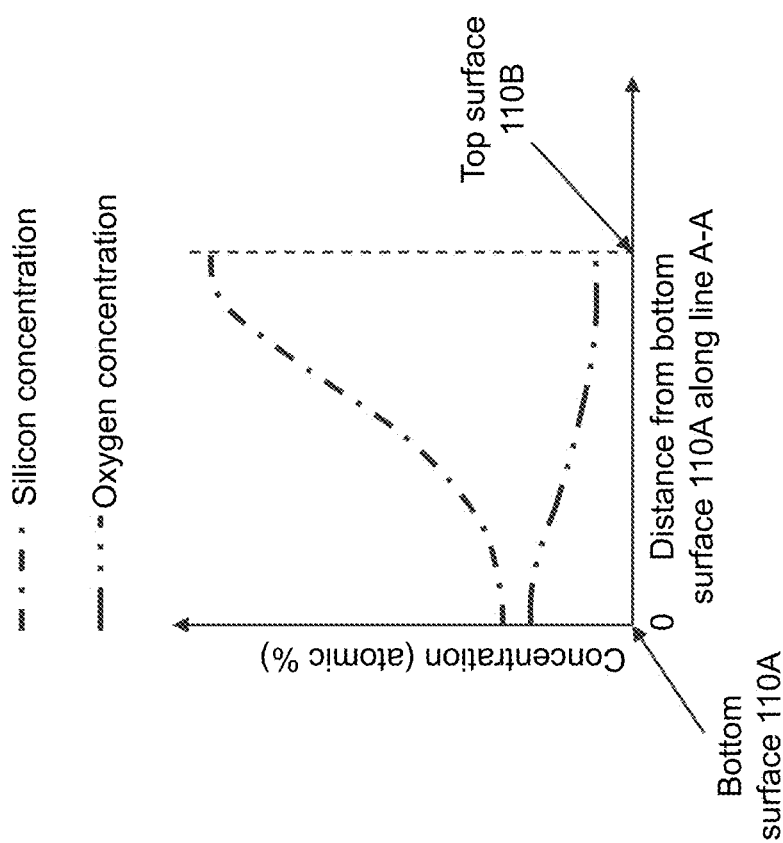

In some embodiments, the atomic concentration profiles of silicon and oxygen in stress adjusting layer 110 along line A-A of FIG. 1A can be non-overlapping with respect to each other and can have graded profiles with a silicon atomic concentration higher than an oxygen atomic concentration, as shown in FIG. 1D. Graded profiles of FIG. 1D shows that atomic concentrations of silicon and oxygen increases and decreases, respectively, from bottom surface 110A towards top surface 110B of stress adjusting layer 110. Stress adjusting layer 110 with graded profiles of FIG. 1D can have a Si:O ratio that increases from bottom surface 110A towards top surface 110B of stress adjusting layer 110, as shown in FIG. 1E.

Figure 1F:
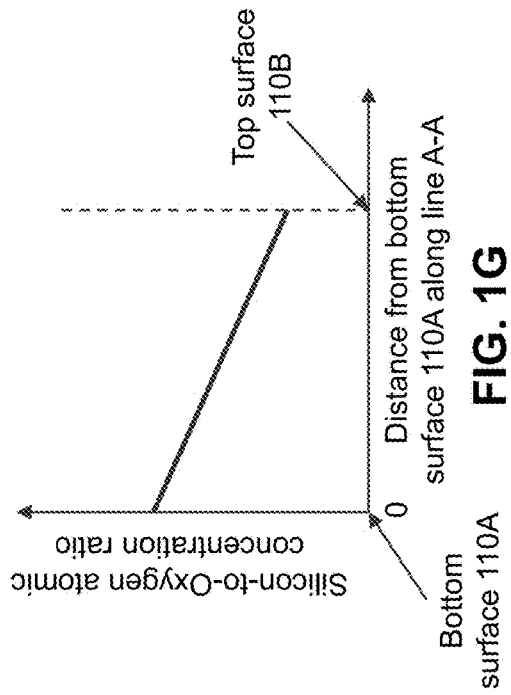
Figure 1G:
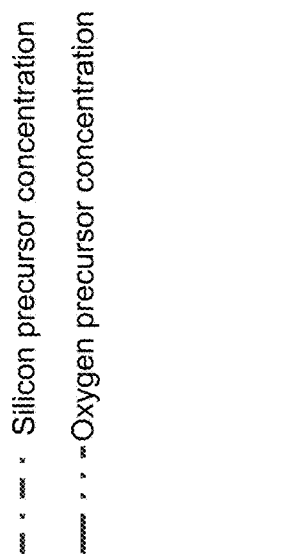
Figure 1H:
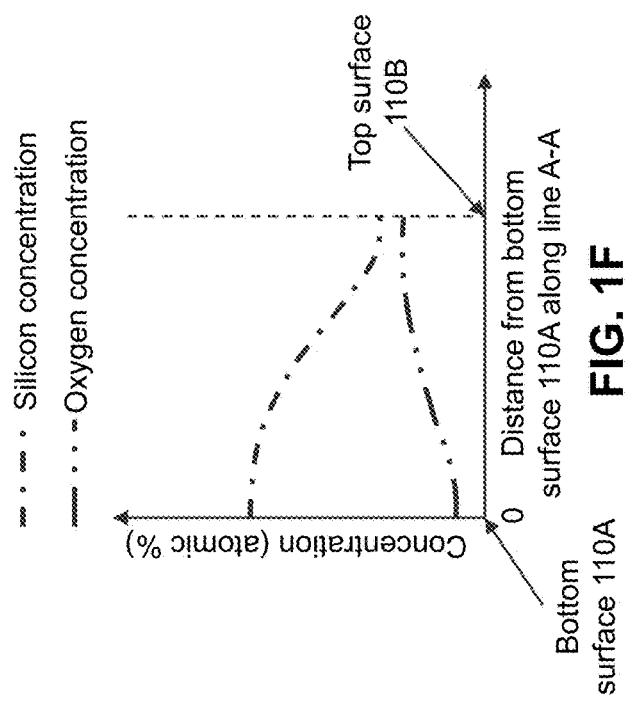

In some embodiments, the atomic concentration profiles of silicon and oxygen in stress adjusting layer 110 along line A-A of FIG. 1A can be non-overlapping with respect to each other and can have graded profiles with a silicon atomic concentration higher than an oxygen atomic concentration, as shown in FIG. 1F. Graded profiles of FIG. 1F shows that atomic concentrations of silicon and oxygen decreases and increases, respectively, from bottom surface 110A towards top surface 110B of stress adjusting layer 110. Stress adjusting layer 110 with graded profiles of FIG. 1F can have a Si:O ratio that decreases from bottom surface 110A towards top surface 110B of stress adjusting layer 110, as shown in FIG. 1G. To form stress adjusting layer 110 with the graded profiles of FIG. 1F, the concentrations of silicon and oxygen precursors can be varied during the formation of stress adjusting layer 110, as shown in FIG. 1H.

In some embodiments, stress adjusting layer 110 can include a bi-layer structure with a bottom layer 110C and a top layer 110D, as shown in FIG. 1I. Bottom layer 110C can include a silicon-rich oxide layer and top layer 110D can include a silicon oxide layer or any other oxide layer. In some embodiments, the atomic concentrations of silicon in bottom and top layers 110C-110D along line B-B of FIG. 1I is substantially constant, whereas the atomic concentration of oxygen is higher in bottom layer 110C than in top layer 110D, as shown in FIG. 1J. In some embodiments, the atomic concentration profiles of silicon and oxygen in stress adjusting layer 110 along line along line B-B of FIG. 1I can be non-overlapping with respect to each other as shown in FIG. 1J. The Si:O ratio in bottom and top layers 110C-110D along line A-A of FIG. 1I corresponding to the profiles of FIG. 1J is shown in FIG. 1K, in which the Si:O ratio is lower in bottom layer 110C than in top layer 110D.

In some embodiments, bottom and top layers 110C-110D can have non-overlapping silicon and oxygen atomic concentration profiles (along line B-B of FIG. 1I) as shown in FIG. 1L, in which the atomic concentrations of silicon and oxygen is higher in bottom layer 110C than in top layer 110D. The different Si:O ratio profiles along line B-B of FIG. 1I corresponding to the profiles of FIG. 1L are shown in FIGS. 1M-1O, according to some embodiments. The Si:O ratio can be constant across bottom and top layers 110C-110D, as shown in FIG. 1M. The Si:O ratio can be lower in bottom layer 110C than in top layer 110D, as shown in FIG. 1N or can be higher in bottom layer 110C than in top layer 110D, as shown in FIG. 1O.

In some embodiments, instead of silicon-rich oxide, stress adjusting layer 110 can include non-stoichiometric magnesium oxide ($MgO_x$), aluminum oxide ($AlO_x$), ytterbium oxide ($YbO_x$), zinc oxide ($ZnO_x$), tantalum oxide ($TaO_x$), zirconium oxide ($ZrO_x$), hafnium oxide ($HfO_x$), tellium oxide ($TeO_x$), or titanium oxide ($TiO_x$). As such, the discussion of the silicon atomic concentration profiles with reference to FIGS. 1B, 1D, 1F, 1J, and 1L can apply to Mg, Al, Yb, Zn, Ta, Zr, Hf, Te, or Ti. The discussion of Si:O ratio with reference to FIGS. 1C, 1E, 1G, 1K, and 1M-1O can apply to the atomic concentration ratio of Mg:O, Al:O, Yb:O, Z:O, Ta:O, Zr:O, Hf:O, Te:O, or Ti:O.

Figure 2:
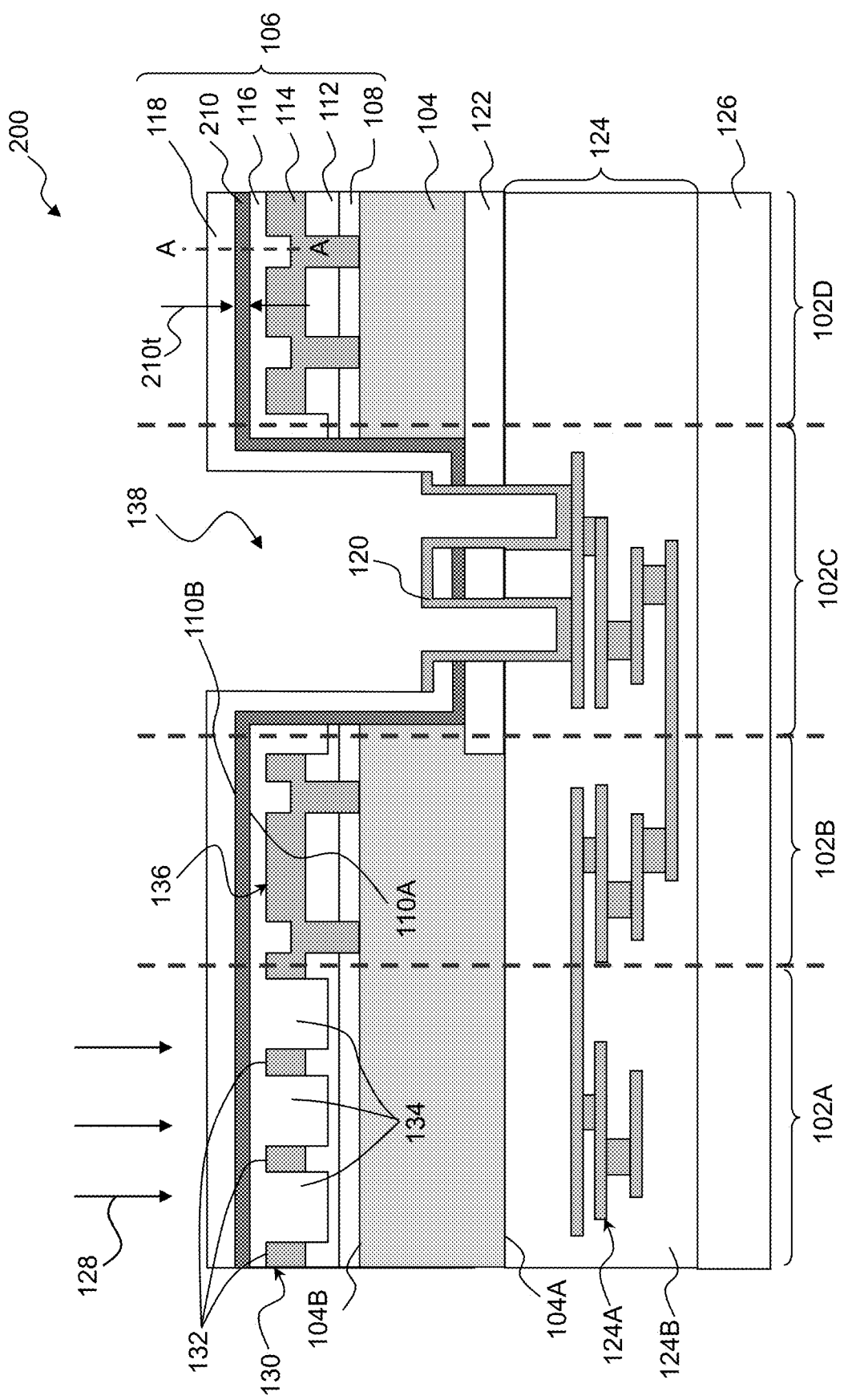
FIGS. 2-5 illustrate cross-sectional views of BSI image sensors with stress adjusting layers, in accordance with some embodiments.

FIG. 2 illustrates a cross-sectional view of a BSI image sensor 200 with pixel region 102A, periphery region 102B, contact pad region 102C, and BSL region 102D, according to some embodiments. The discussion of BSI image sensor 100 applies to BSI image sensor 200, unless mentioned otherwise. Elements in FIG. 2 with same annotations as elements in FIGS. 1A-1O are described above.

BSI image sensor 200 can include stack of layers 106 with ARC layer 108 disposed on back side surface 104B, first dielectric layer 112 disposed on ARC layer 108, metal layer 114 disposed on first dielectric layer 112, second dielectric layer 116 disposed on metal layer 114, a stress adjusting layer 210 disposed on second dielectric layer 116, and third dielectric layer 118 disposed on stress adjusting layer 210. The discussion of stress adjusting layer 110 with reference to FIGS. 1A-1O applies to stress adjusting layer 210, unless mentioned otherwise. Stress adjusting layer 210 can be interposed between second and third dielectric layers 116 and 118 to prevent the formation of residual stress between second and third dielectric layers 116 and 118. In addition, stress adjusting layer 210 can be disposed on sidewalls of contact pad opening 138 to prevent the formation of residual stress within the portions of third dielectric layer 118 that are on the sidewalls of contact pad opening 138. Without the use of stress adjusting layer 210, such residual stress can lead to the formation of cracks within second and third dielectric layers 116 and/or 118 and/or the peeling of third dielectric layer 118 from the sidewalls of contact pad opening 138, resulting in device failure.

Stress adjusting layer 210 can be formed with a structure and/or composition that can induce stress to counteract the residual stress within second dielectric layer 116 and/or third dielectric layer 118. In some embodiments, stress adjusting layer 210 can have a thickness 210t ranging from about 10 nm to about 500 nm. Thickness 210t outside the range of about 10 nm to about 500 nm may not induce an adequate level of stress in second dielectric layer 116 and/or third dielectric layer 118 to counteract their residual stress. In some embodiments, stress adjusting layer 210 can include a silicon-rich oxide layer with a silicon concentration ranging from about 45 atomic % to about 65 atomic % to achieve an adequate level of stress in stress adjusting layer 210 to counteract the residual stress within second dielectric layer 116 and/or third dielectric layer 118. In some embodiments, for effective removal of the residual stress from second dielectric layer 116 and/or third dielectric layer 118, stress adjusting layer 210 can have a Si:O ratio ranging from about 28:15 to about 28:31.

Figure 3:
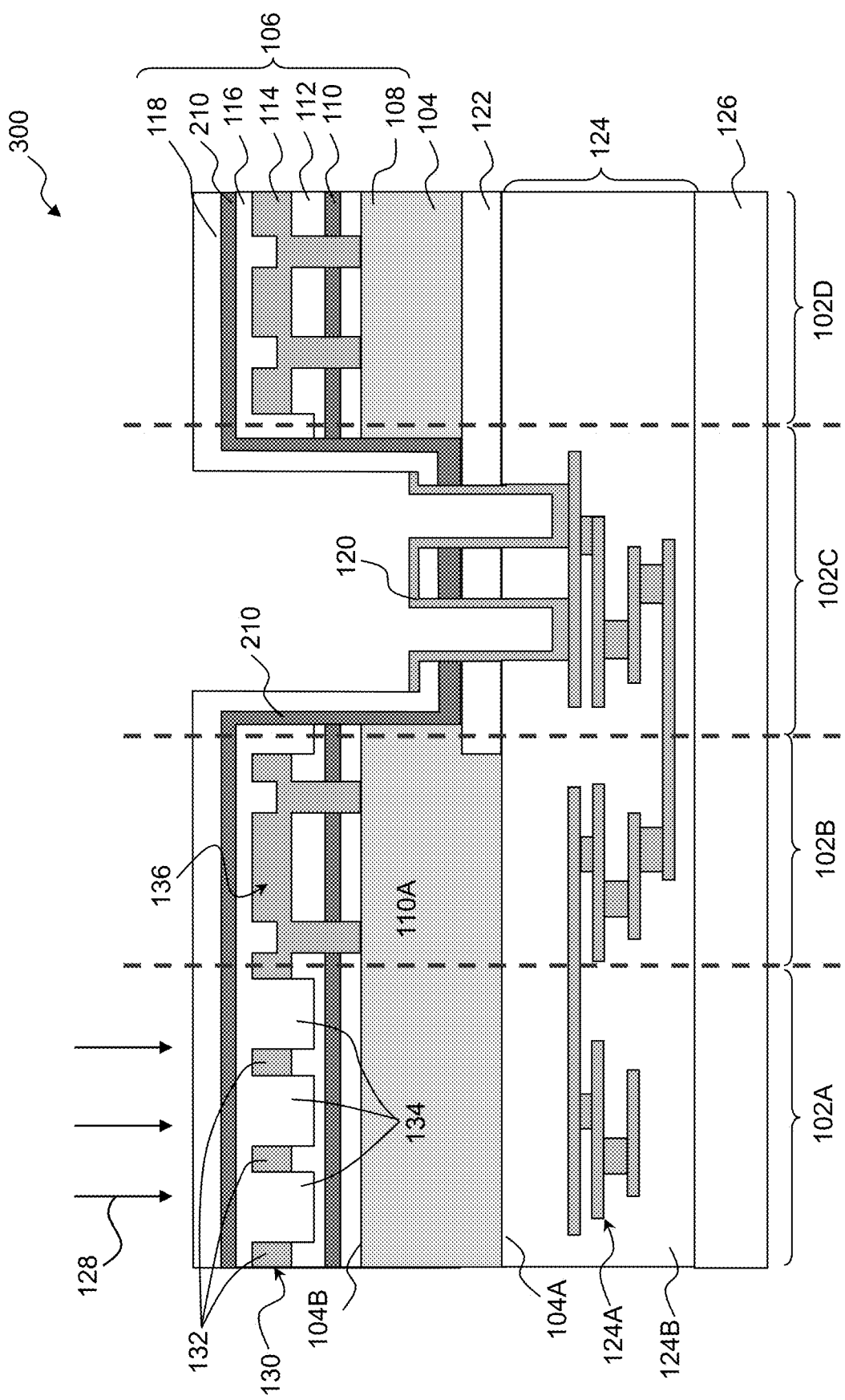

FIG. 3 illustrates a cross-sectional view of a BSI image sensor 300 with pixel region 102A, periphery region 102B, contact pad region 102C, and BSL region 102D, according to some embodiments. The discussion of BSI image sensors 100 and 200 applies to BSI image sensor 300, unless mentioned otherwise. Elements in FIG. 3 with same annotations as elements in FIGS. 1A-1O and FIG. 2 are described above. Similar to BSI image sensors 100 and 200, BSI image sensor 300 can include stress adjusting layer 110 interposed between ARC layer 108 and first dielectric layer 112 and stress adjusting layer 210 interposed between second and third dielectric layers 116 and 118.

In some embodiments, stress adjusting layers 110 and 210 can have material compositions similar to or different from each other. Stress adjusting layers 110 and 210 can have silicon concentrations similar to or different from each other within the range of about 45 atomic % to about 65 atomic % and can have Si:O ratios similar to or different from each other within the range of about 28:15 to about 28:31. The atomic concentration profiles of silicon and oxygen and the Si:O ratio profiles across stress adjusting layers 110 and 210 can be similar to or different from each other. In some embodiments, one of stress adjusting layers 110 and 210 can have a bi-layer structure as shown in FIG. 1I or both stress adjusting layers 110 and 210 can have the bi-layer structure.

Figure 4:
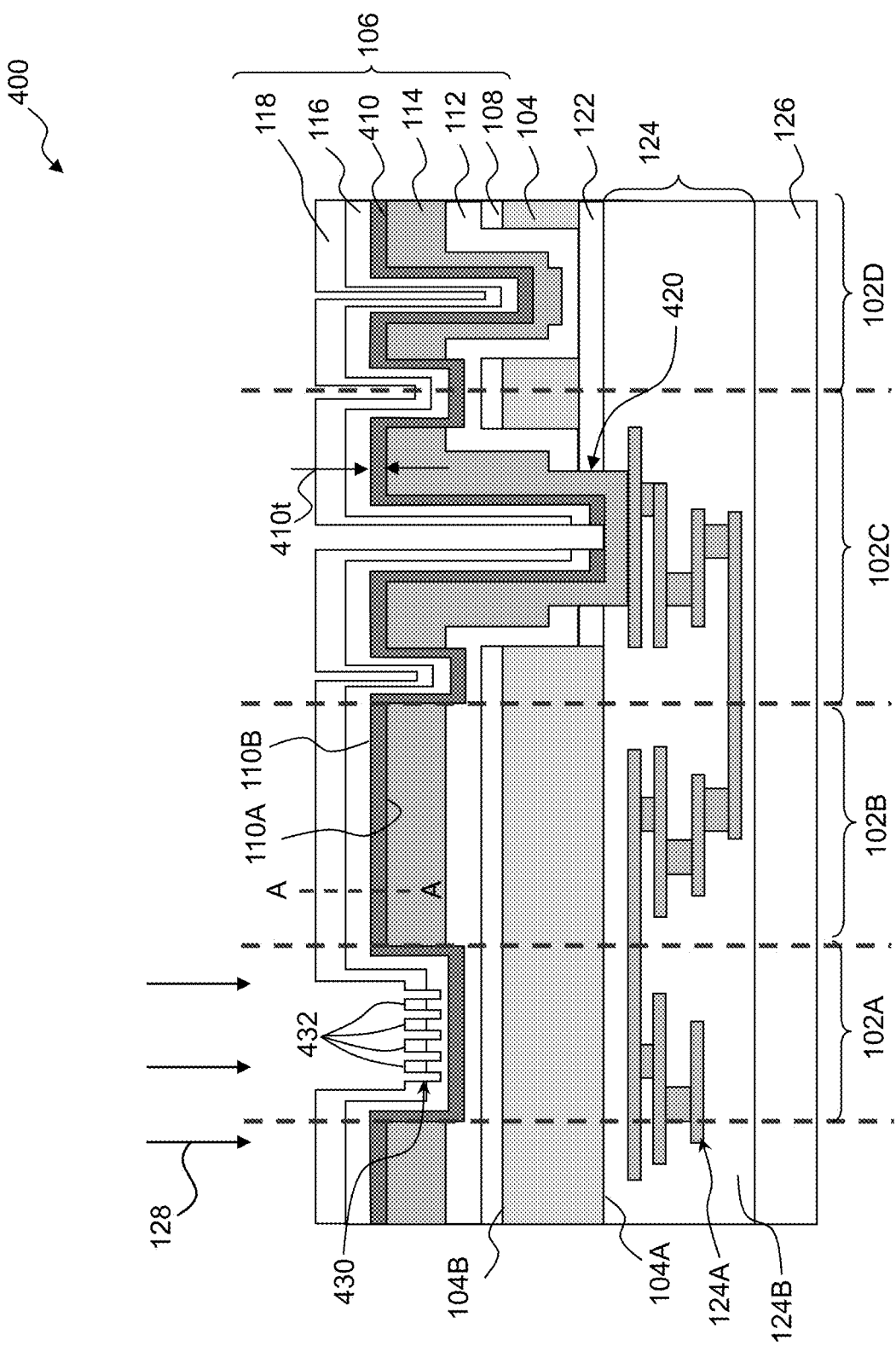

FIG. 4 illustrates a cross-sectional view of a BSI image sensor 400 with pixel region 102A, periphery region 102B, contact pad region 102C, and BSL region 102D, according to some embodiments. The discussion of BSI image sensor 100 applies to BSI image sensor 400, unless mentioned otherwise. Elements in FIG. 4 with same annotations as elements in FIGS. 1A-1O are described above.

BSI image sensor 400 can include a stack of layers 106 disposed on back side surface 104B, a shallow trench isolation region 120 disposed within substrate 104, a multi-level metallization layer 124 disposed on front side surface 104A, a pad structure 420 disposed within contact pad region 102C, and a carrier substrate 126. Pad structure 420 is an input/output (I/O) port of BSI image sensor 400 and includes a conductive layer 114 that is electrically coupled to a multi-level interconnect structure 124A embedded in an inter-metal dielectric (IMD) layer 124B.

Pixel region 102A can include an oxide grid structure 430 with grid lines 432 that isolates pixels from each other and is configured to receive incident radiation beams 128, which are converted to an electrical signal through stack of layers 106 in pixel region 102A. The electrical signal is distributed by pad structure 420 and multi-level metallization layer 124 to carrier substrate 126 or an external circuit.

Stack of layers 106 can include an ARC layer 108 disposed on back side surface 104B, first dielectric layer 112 disposed on ARC layer 108, metal layer 114 disposed on first dielectric layer 112, a stress adjusting layer 410 disposed on metal layer 114, second dielectric layer 116 disposed stress adjusting layer 410, and third dielectric layer 118 disposed on second dielectric layer 116. The discussion of stress adjusting layer 110 with reference to FIGS. 1A-1O applies to stress adjusting layer 410, unless mentioned otherwise. Stress adjusting layer 410 can be interposed between metal layer 114 and second dielectric layer 116 to prevent the formation of residual stress between metal layer 114 and second dielectric layer 116. Without the use of stress adjusting layer 410, such residual stress can lead to the formation of cracks within metal layer 114 and/or second dielectric layer 116, resulting in device failure.

Stress adjusting layer 410 can be formed with a structure and/or composition that can induce stress to counteract the residual stress within metal layer 114 and/or second dielectric layer 116. In some embodiments, stress adjusting layer 410 can have a thickness 410t ranging from about 10 nm to about 500 nm. Thickness 410t outside the range of about 10 nm to about 500 nm may not induce an adequate level of stress in metal layer 114 and/or second dielectric layer 116 to counteract their residual stress. In some embodiments, stress adjusting layer 410 can include a silicon-rich oxide layer with a silicon concentration ranging from about 45 atomic % to about 65 atomic % to achieve an adequate level of stress in stress adjusting layer 410 to counteract the residual stress within metal layer 114 and/or second dielectric layer 116. In some embodiments, for effective removal of the residual stress from metal layer 114 and/or second dielectric layer 116, stress adjusting layer 410 can have a Si:O ratio ranging from about 28:15 to about 28:31.

Figure 5:
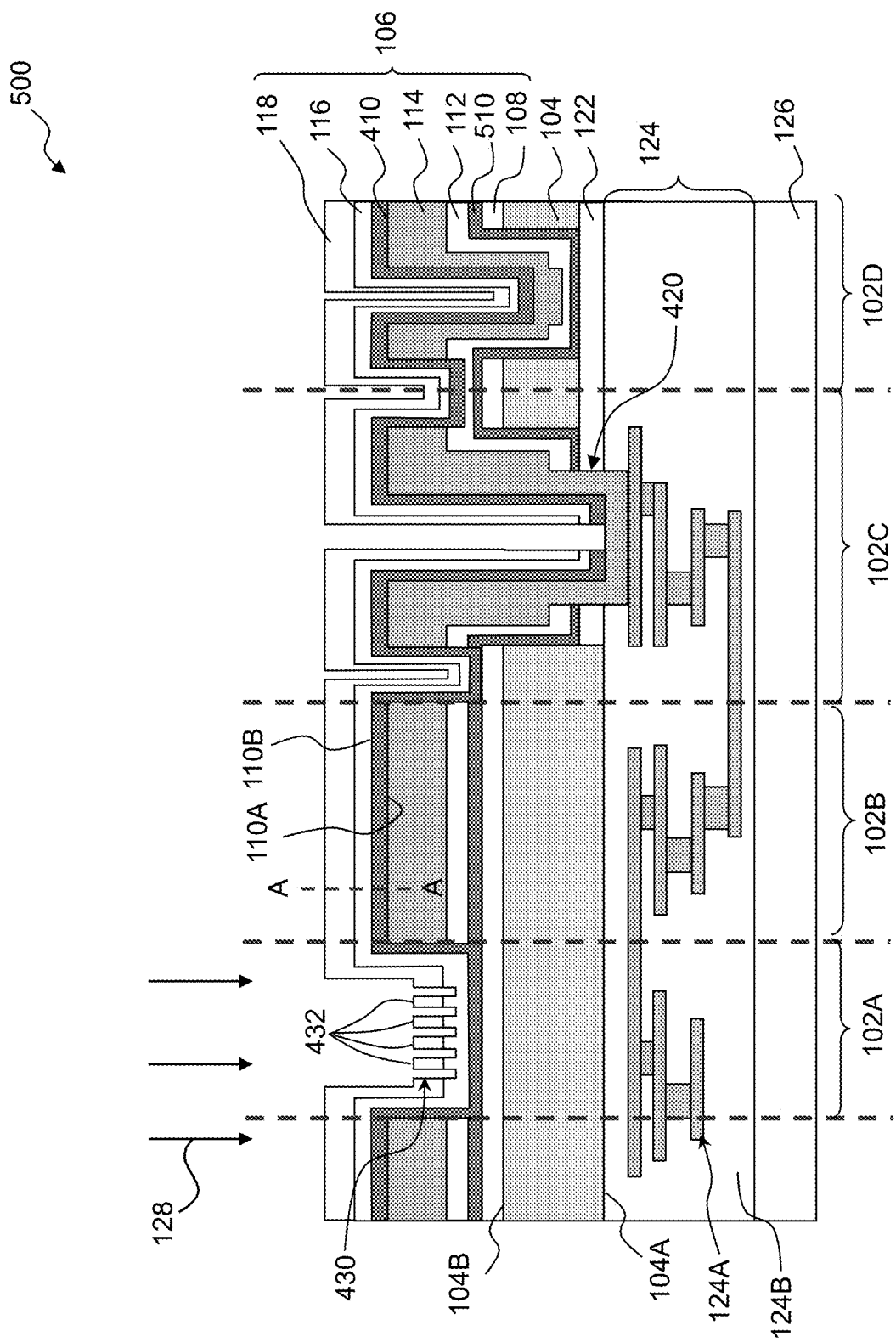

FIG. 5 illustrates a cross-sectional view of a BSI image sensor 500 with pixel region 102A, periphery region 102B, contact pad region 102C, and BSL region 102D, according to some embodiments. The discussion of BSI image sensor 400 applies to BSI image sensor 500, unless mentioned otherwise. Elements in FIG. 5 with same annotations as elements in FIG. 4 are described above.

In addition of stress adjusting layer 410, BSI image sensor 500 can include a stress adjusting layer 510 interposed between ARC layer 108 and first dielectric layer 112. The discussion of stress adjusting layer 110 with reference to FIGS. 1A-1O applies to stress adjusting layer 510, unless mentioned otherwise. In some embodiments, stress adjusting layers 410 and 510 can have material compositions similar to or different from each other. Stress adjusting layers 410 and 510 can have silicon concentrations similar to or different from each other within the range of about 45 atomic % to about 65 atomic % and can have Si:O ratios similar to or different from each other within the range of about 28:15 to about 28:31. The atomic concentration profiles of silicon and oxygen and the Si:O ratio profiles across stress adjusting layers 410 and 510 can be similar to or different from each other. In some embodiments, one of stress adjusting layers 410 and 510 can have a bi-layer structure as shown in FIG. 1I or both stress adjusting layers 410 and 510 can have the bi-layer structure.

Figure 6:
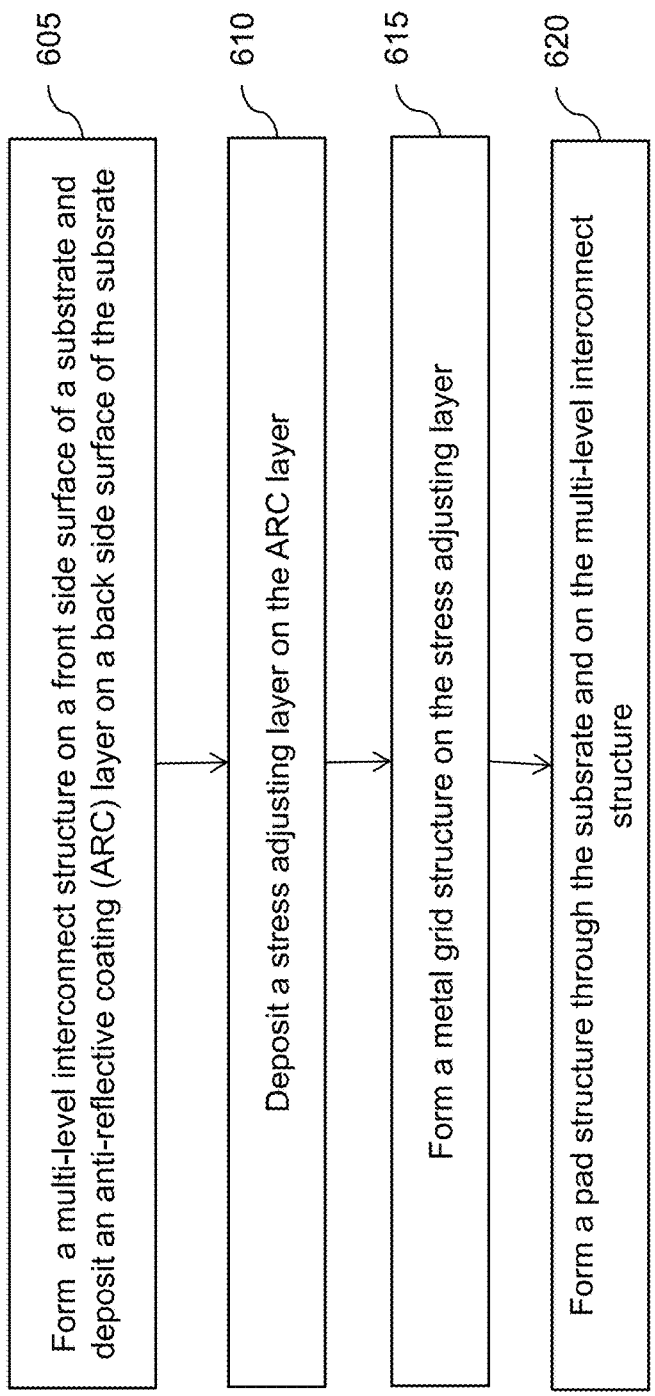
FIG. 6 is a flow diagram of a method for fabricating a BSI image sensor with a stress adjusting layer, in accordance with some embodiments.

FIG. 6 is a flow diagram of an example method 600 for fabricating BSI image sensor 100, according to some embodiments. For illustrative purposes, the operations illustrated in FIG. 6 will be described with reference to FIGS. 7-17, which shows cross-sectional views of BSI image sensor 100 at various stages of its fabrication process, according to some embodiments. Operations can be performed in a different order or not performed depending on specific applications. It should be noted that method 600 may not produce a complete BSI image sensor 100. Accordingly, it is understood that additional processes can be provided before, during, and after method 600, and that some other processes may only be briefly described herein. Elements in FIGS. 7-17 with the same annotations as elements in FIGS. 1A-1O are described above.

Figure 7:
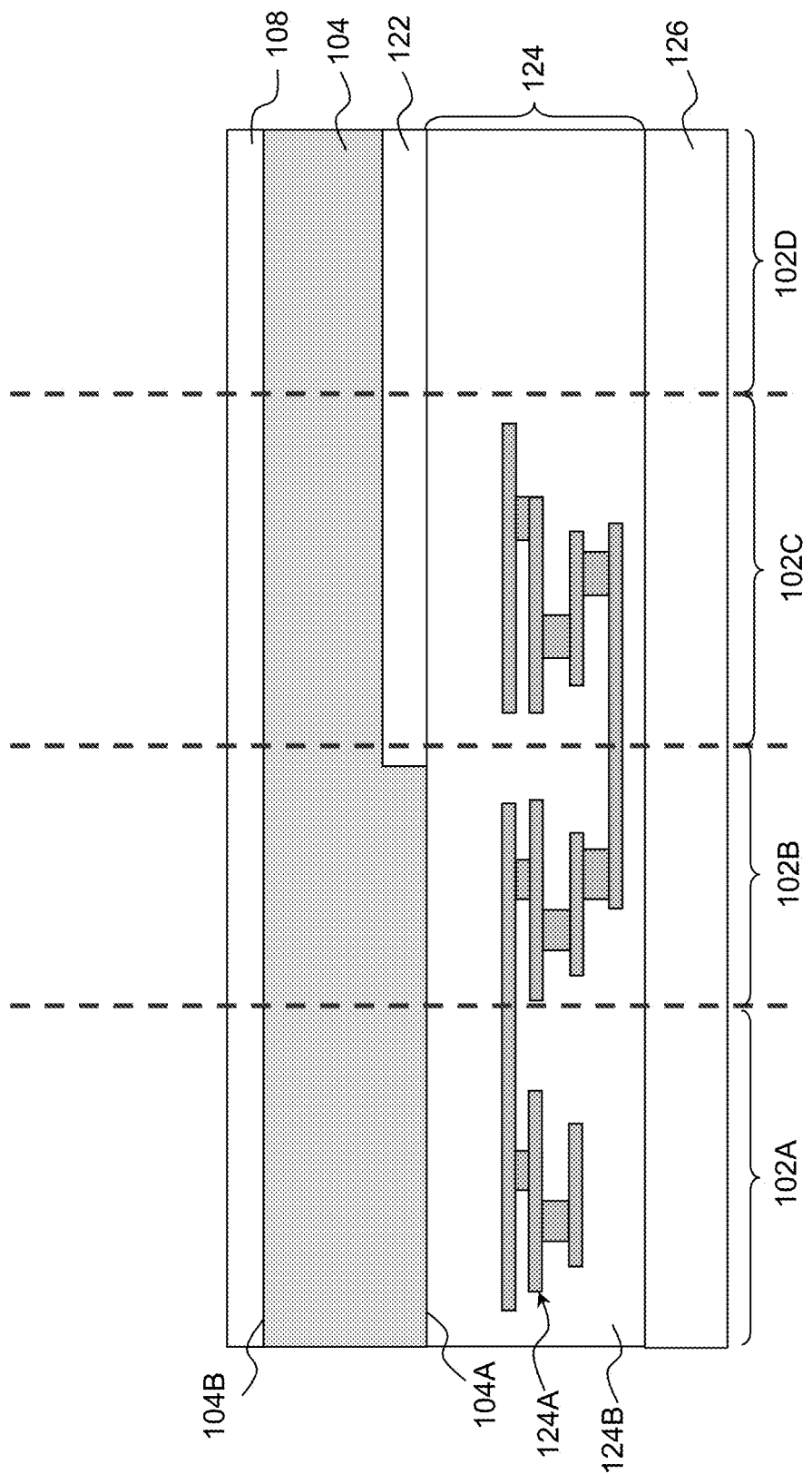
FIGS. 7-17 illustrate cross-sectional views of a BSI image sensor with a stress adjusting layer at various stages of its fabrication process, in accordance with some embodiments.

In operation 605, a multi-level interconnect structure is formed on a front side surface of a substrate and an ARC layer is deposited on a back side surface of the substrate. For example, as shown in FIG. 7, multi-level metallization layer 124 with multi-level interconnect structure 124A embedded within IMD layer 124B can be formed on front side surface 104A of substrate 104 and ARC layer 108 can be deposited on back side surface 104B. The formation of multi-level metallization layer 124 on front side surface 104A can be followed by bonding carrier substrate 126 to multi-level metallization layer 124 and subsequently depositing ARC layer 108 on back side surface 108.

Figure 8:
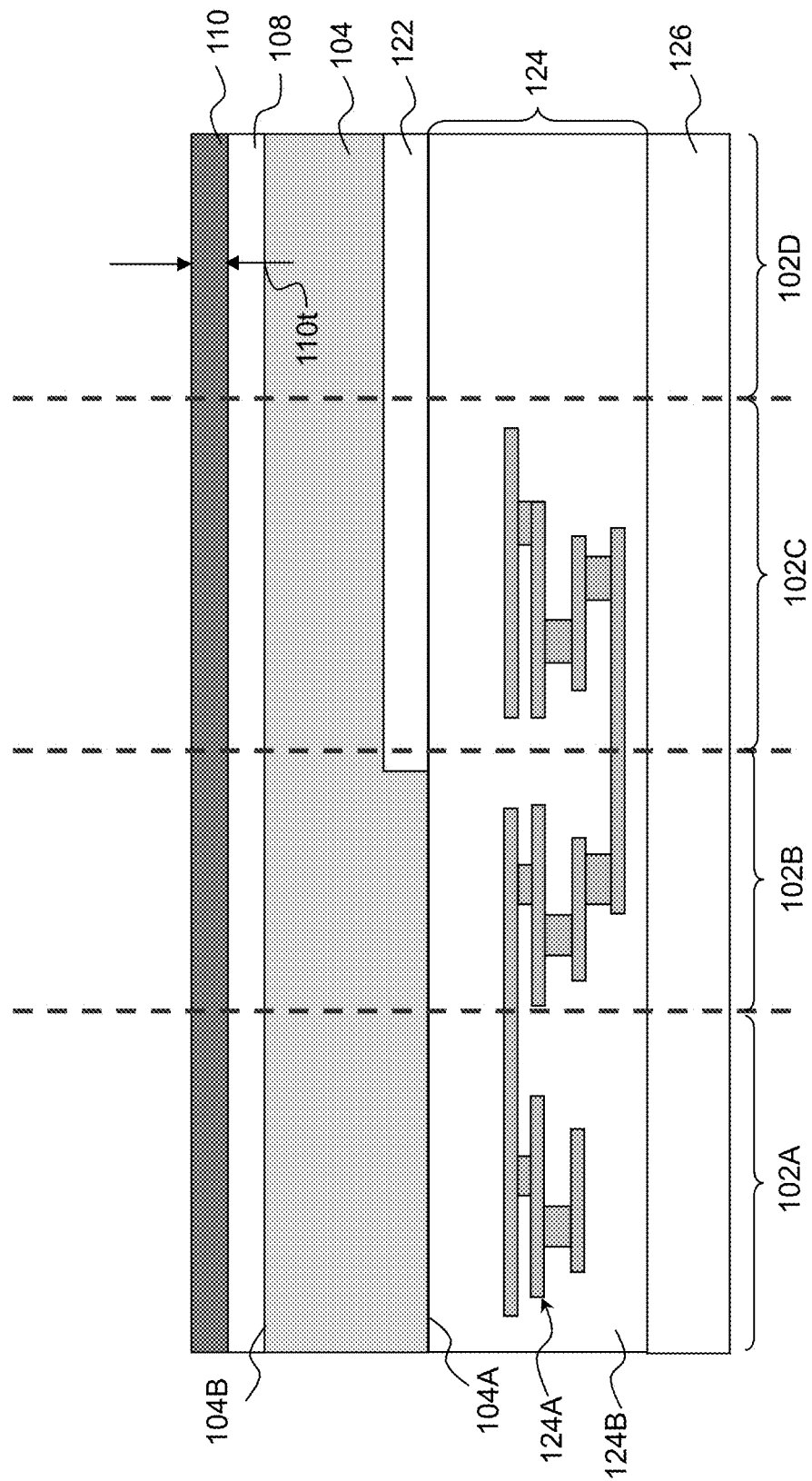

In operation 610, a stress adjusting layer is deposited on the ARC layer. For example, as shown in FIG. 8, stress adjusting layer 110 can be deposited on the structure of FIG. 7. The process of depositing stress adjusting layer 110 on the structure of FIG. 7 can include depositing a silicon-rich oxide layer using an atomic layer deposition (ALD) process, a molecular beam expitaxy (MBE) process, or a chemical vapor deposition (CVD) process. The process of depositing stress adjusting layer 110 can further include using silane gas ($SiH_4$) and nitrogen ($N_2$) gas as precursors and a $SiH_4$-to-$N_2$ gas flow ratio ranging from about 1:1 to about 1:2. In some embodiments, stress adjusting layer 110 can be deposited with a thickness 110t ranging from about 10 nm to about 500 nm, a silicon concentration ranging from about 45 atomic % to about 65 atomic %, and a Si:O ratio ranging from about 28:15 to about 28:31.

Figure 9:
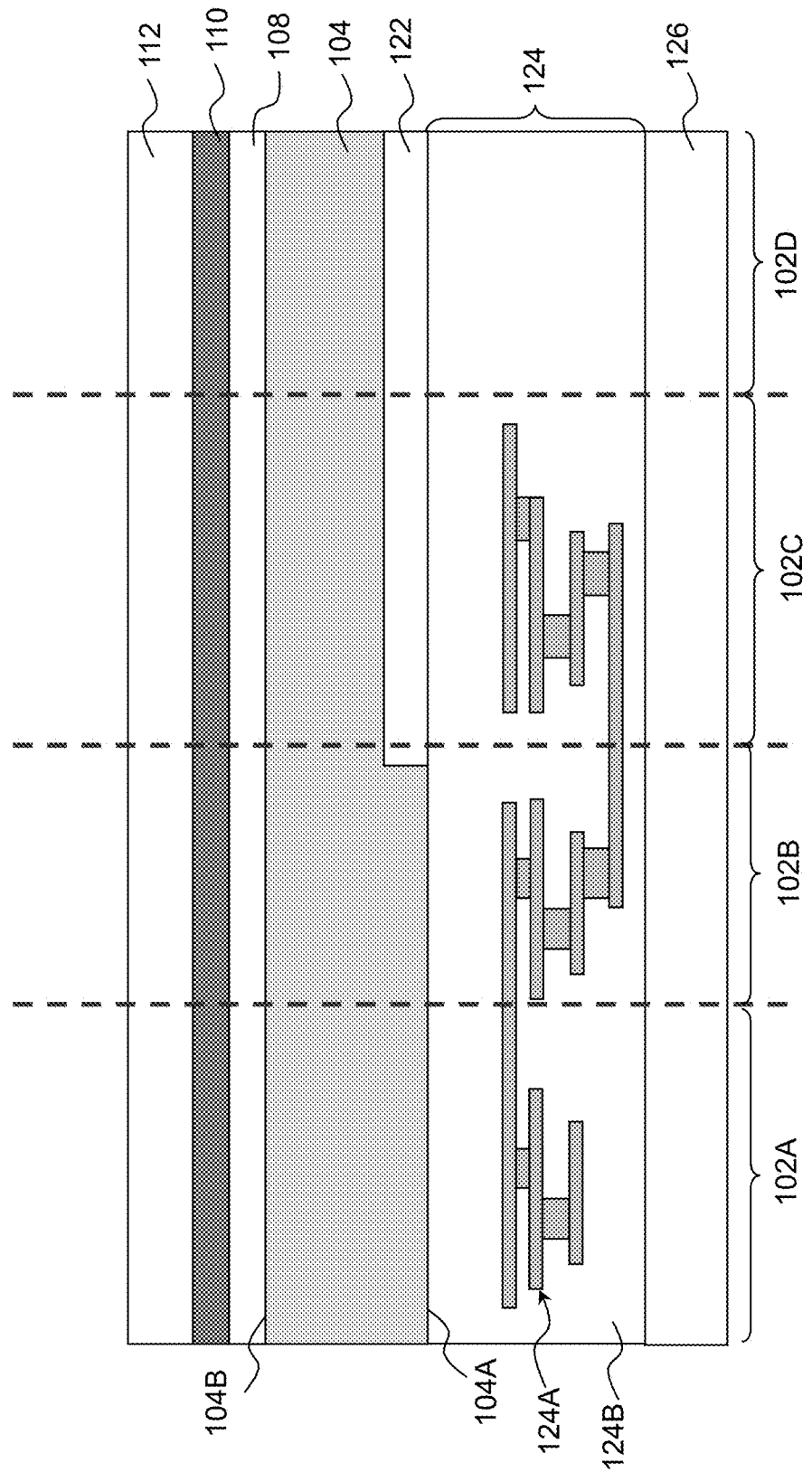
Figure 10:
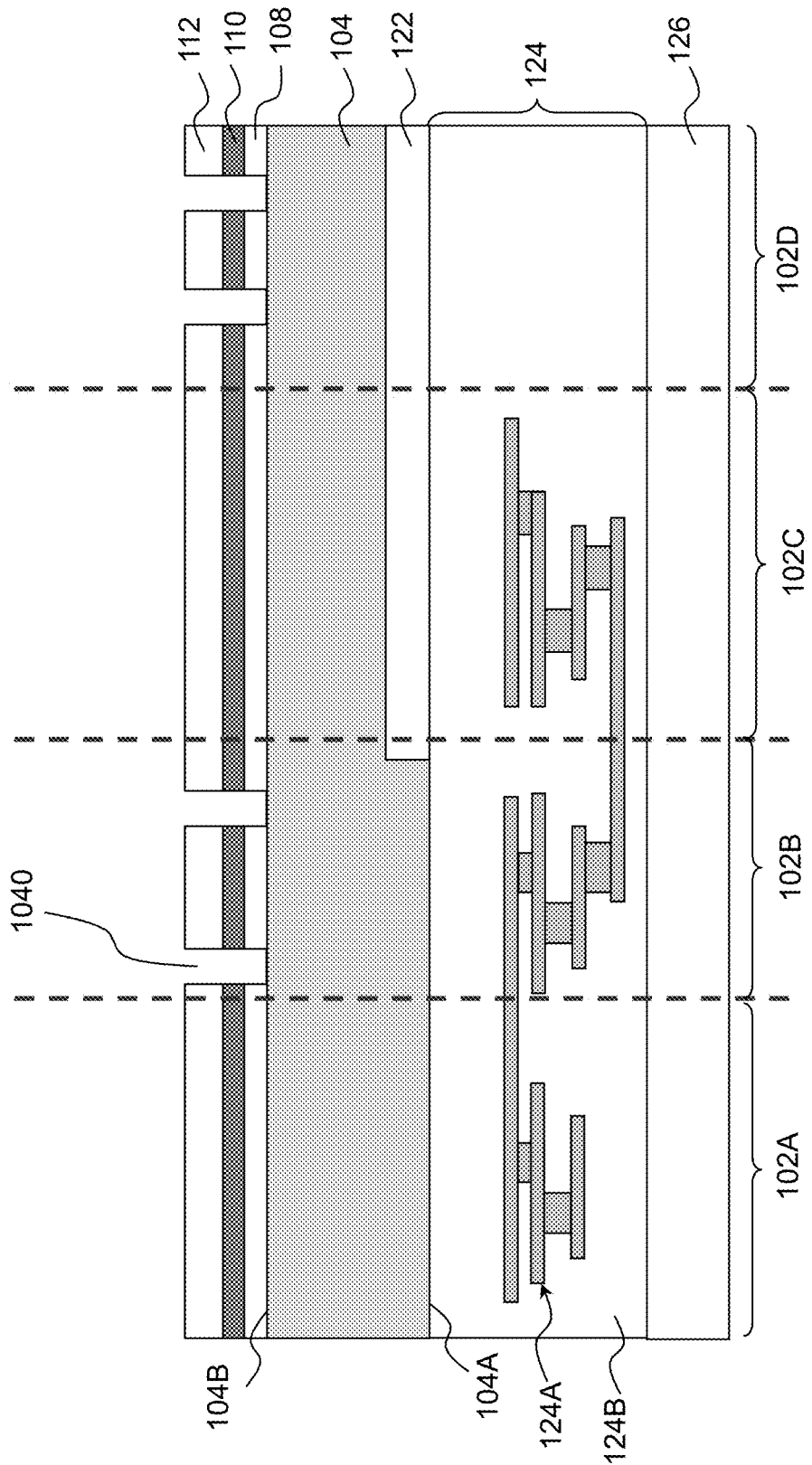
Figure 11:
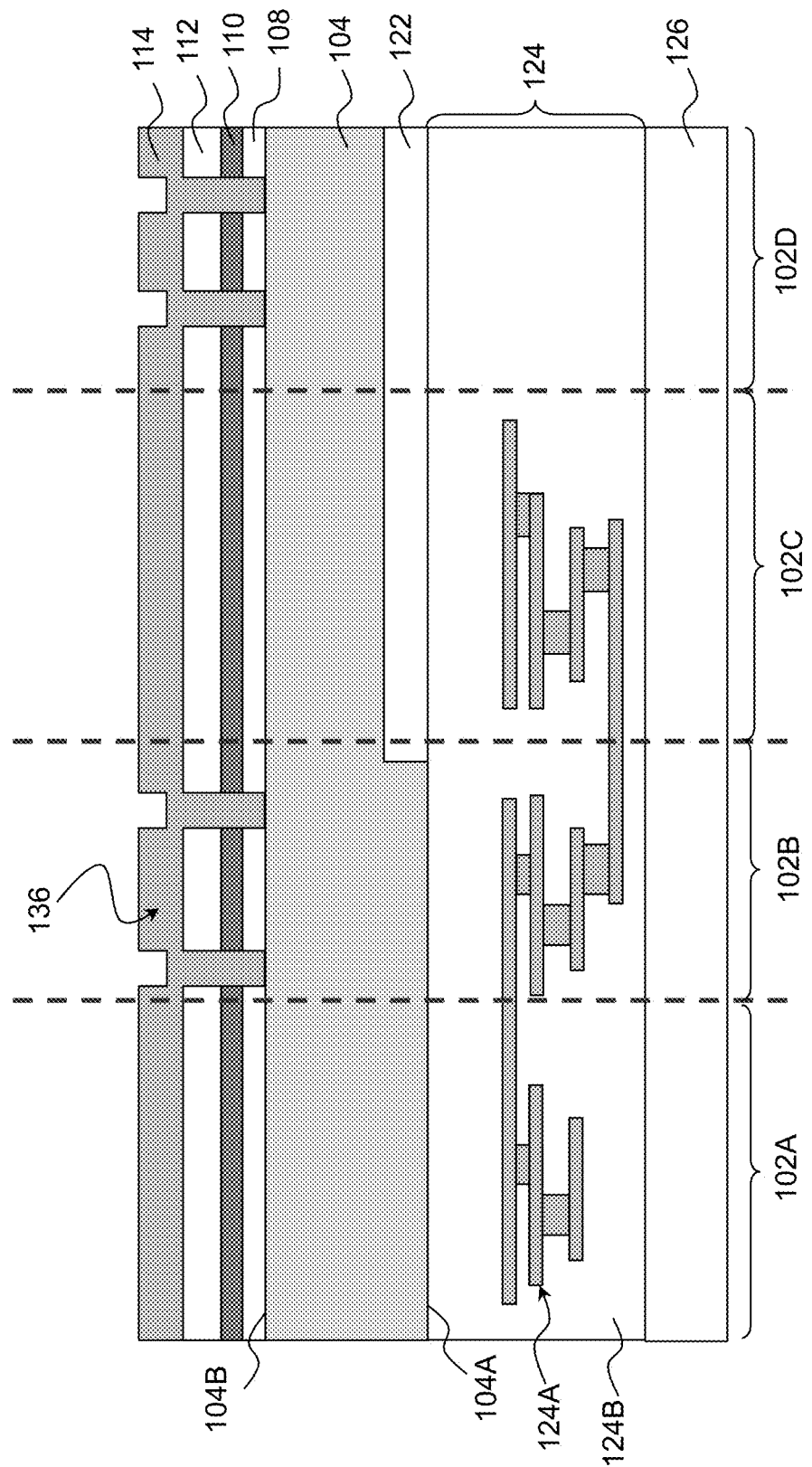
Figure 12:
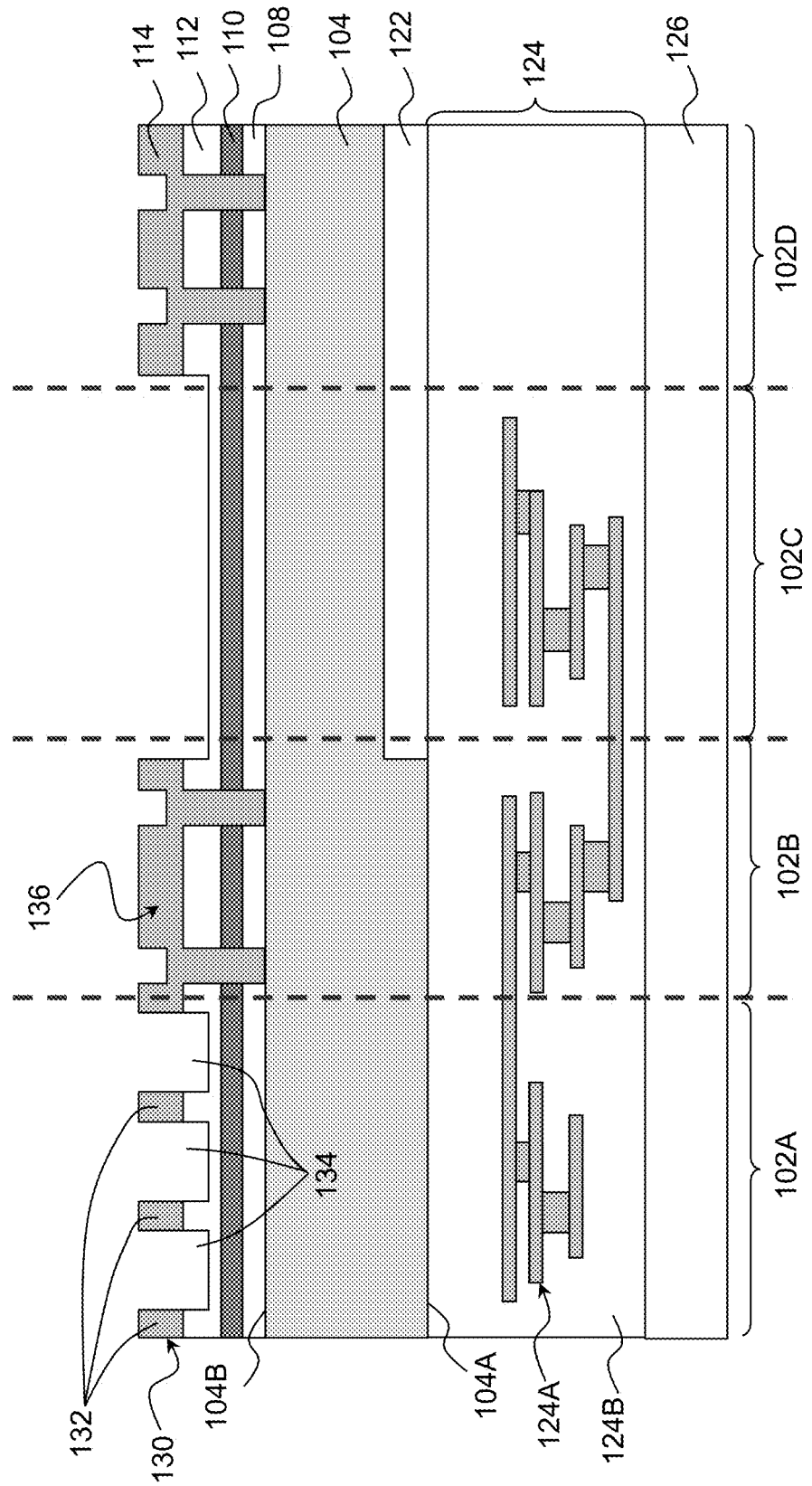

In operation 615, a metal grid structure is formed on the stress adjusting layer. For example, as shown in FIG. 12, metal grid structure 130 can be formed on stress adjusting layer 110. The formation of metal grid structure 130 can include sequential operations of (i) depositing first dielectric layer 112 on stress adjusting layer 110, as shown in FIG. 9; (ii) forming openings 1040 within the stack of ARC layer 108, stress adjusting layer 110, and first dielectric layer 112, as shown in FIG. 10; (iii) depositing metal layer 114 on first dielectric layer 112, as shown in FIG. 11; and (iv) patterning and etching metal layer 114 and first dielectric layer 112 to form grid lines 132 and pixels 134, as shown in FIG. 12. In some embodiments, depositing first dielectric layer 112 can include depositing an oxide layer using a PECVD process. In some embodiments, depositing metal layer 114 can include depositing a layer of aluminum (Al), copper (Cu), tantalum (Ta), titanium (Ti), a combination thereof, or other suitable metallic materials on first dielectric layer 112.

Figure 13:
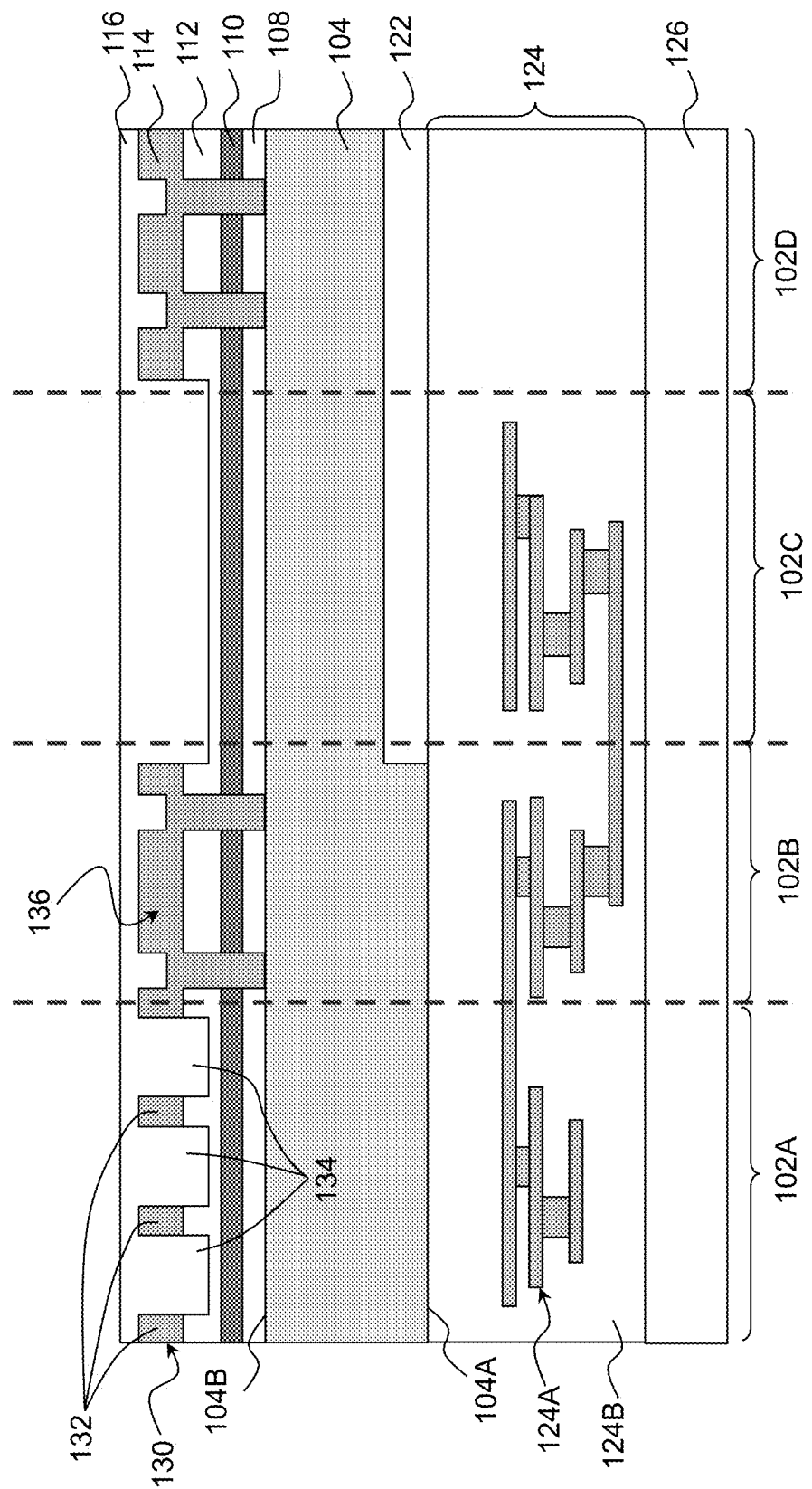
Figure 14:
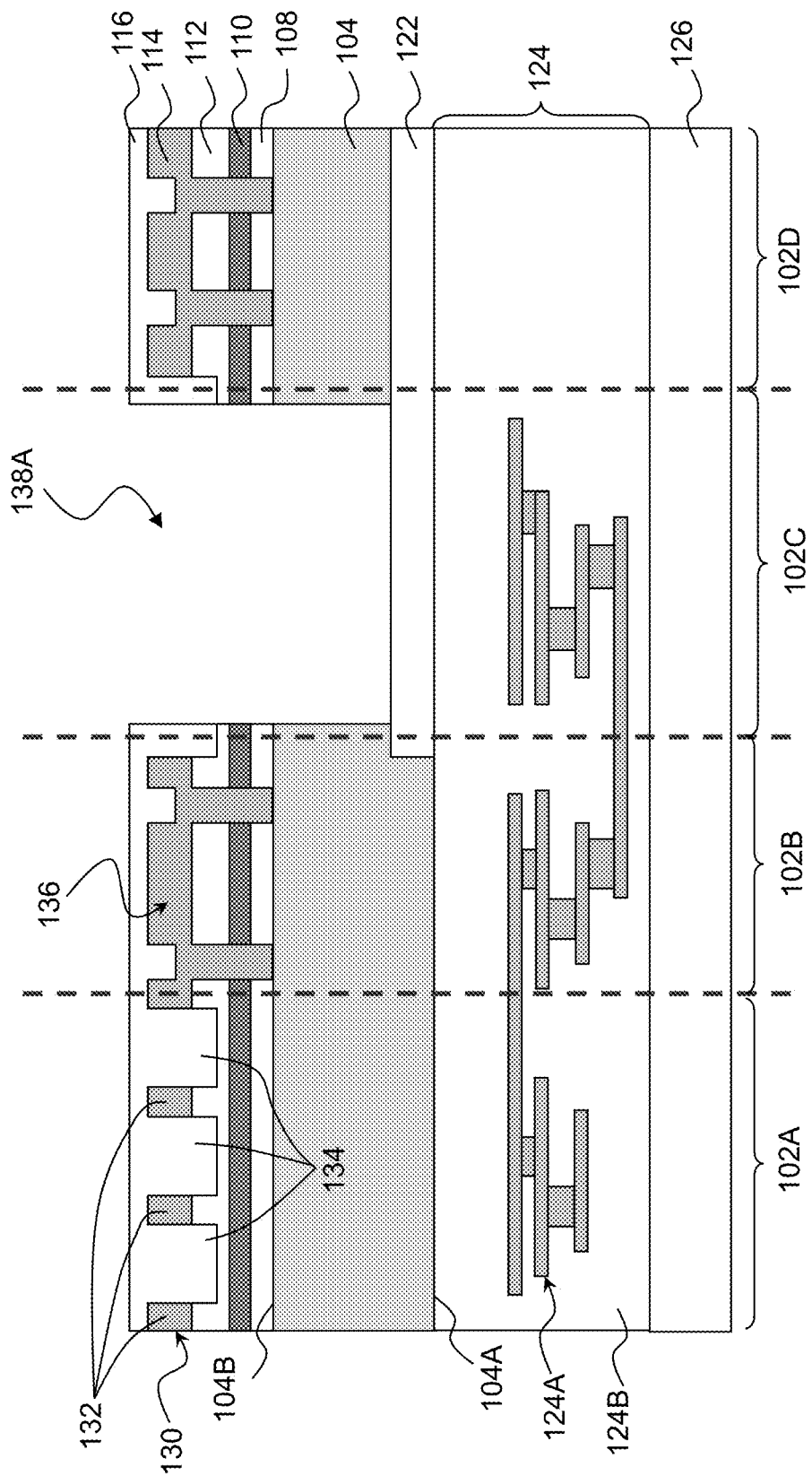
Figure 15:
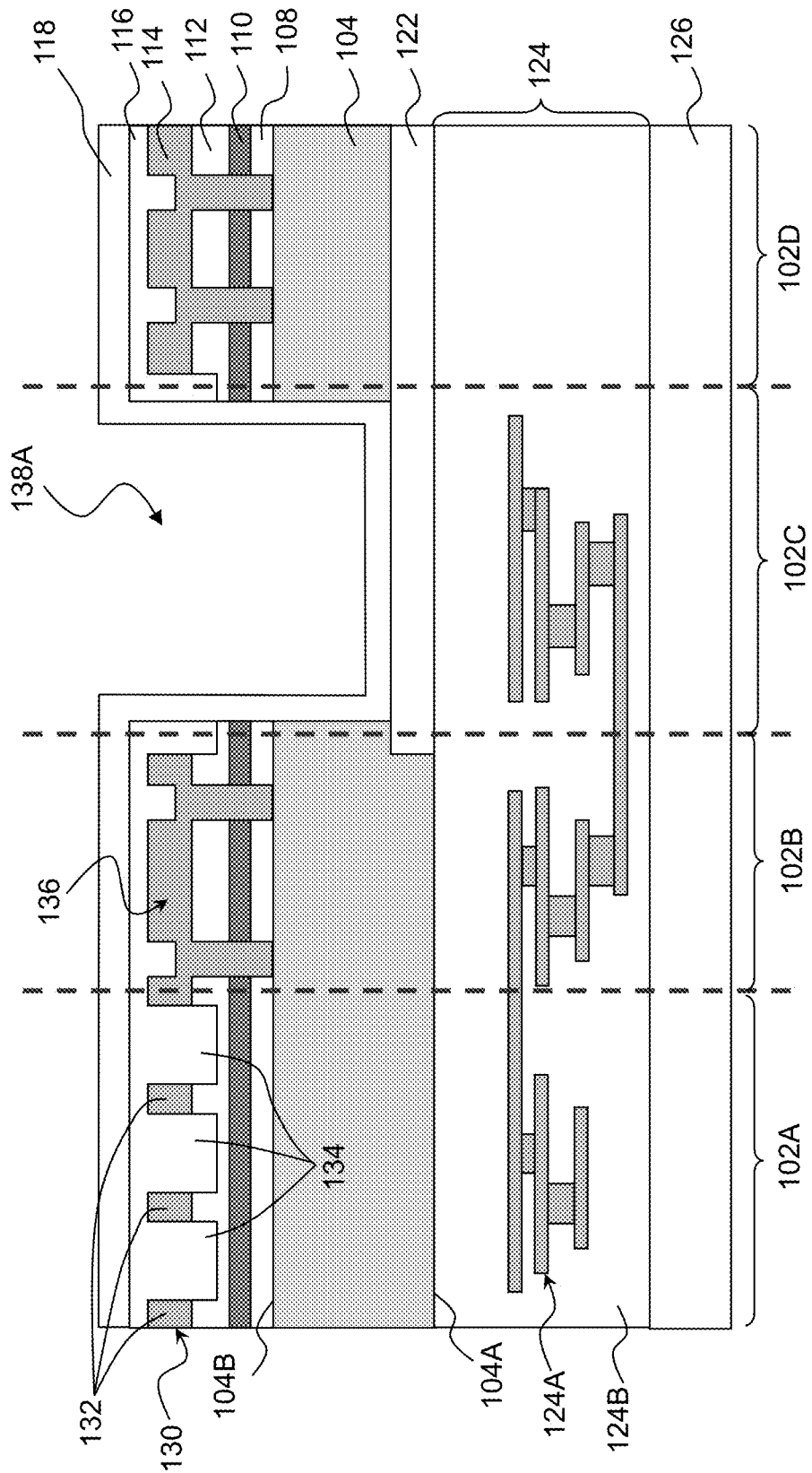
Figure 16:
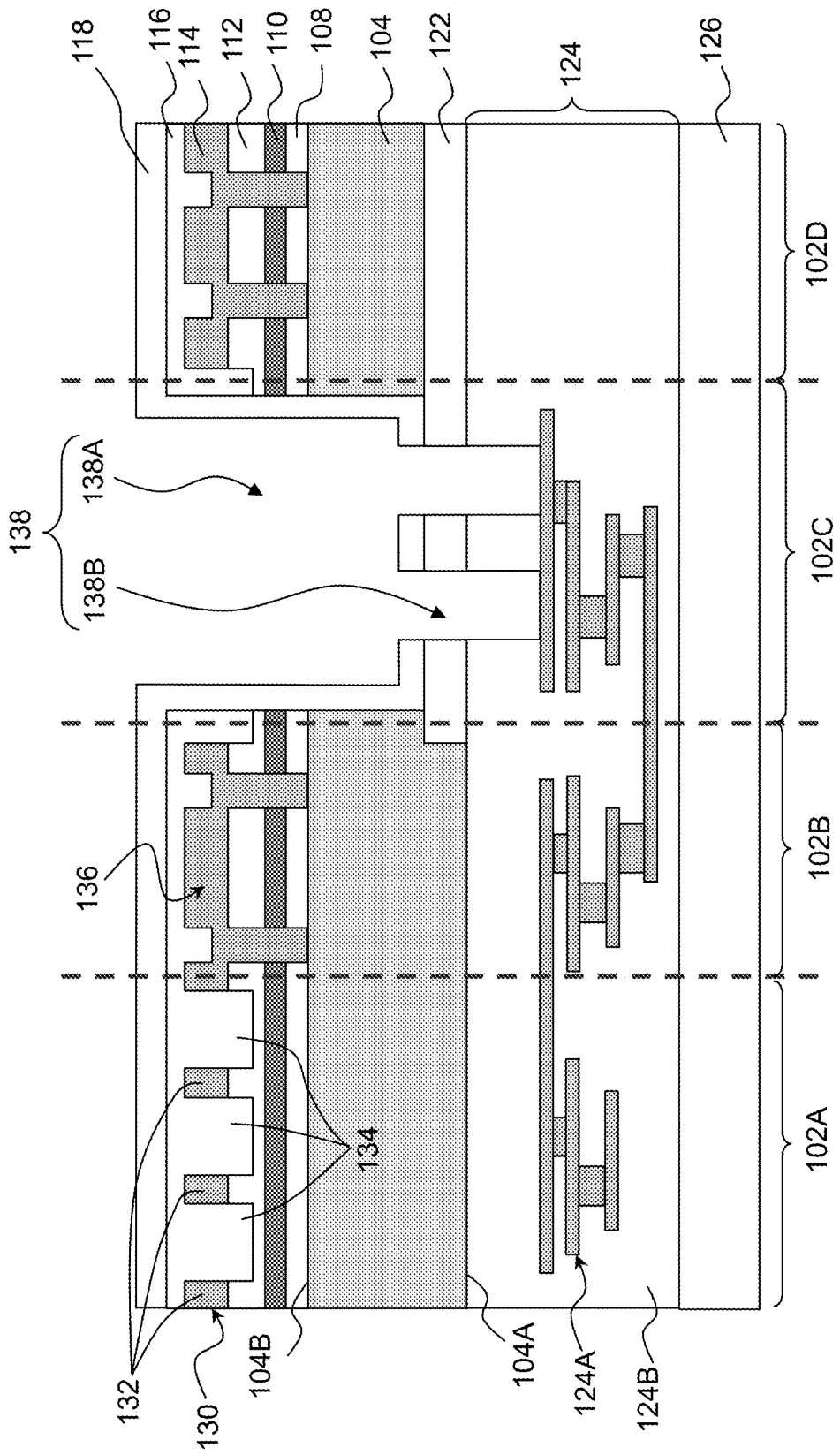
Figure 17:
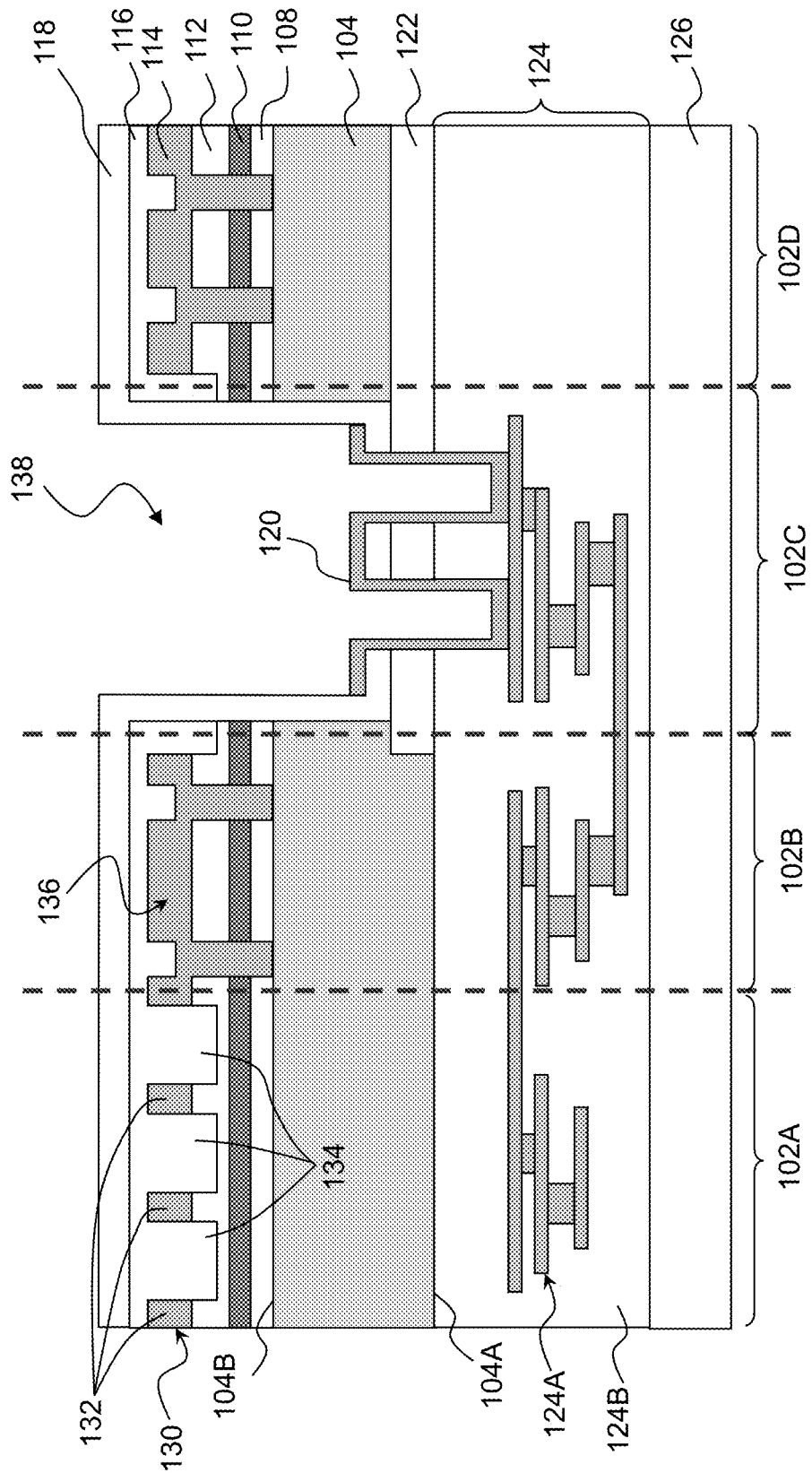

In operation 620, a pad structure is formed through the substrate and on the multi-level interconnect structure. For example, as shown in FIG. 17, pad structure 120 can be formed on multi-level interconnect structure 124A. The formation of pad structure 120 can include sequential operations of (i) depositing second dielectric layer 116 on the structure of FIG. 12, as shown in FIG. 13; (ii) forming a first cavity portion 138A of contact pad opening 138 within substrate 104 through back side surface 104B, as shown in FIG. 14; (iii) depositing third dielectric layer 118 on the structure of FIG. 14, as shown in FIG. 15; (iv) forming a second cavity portion 138B of contact pad opening 138 through STI region 122 and IMD layer 124B, as shown in FIG. 16; (v) depositing a conductive layer on the structure of FIG. 16; and (vi) patterning and etching the conductive layer to form pad structure 120 within contact pad opening 138, as shown in FIG. 17.

In some embodiments, depositing second dielectric layer 116 can include depositing an oxide layer using a PECVD process and depositing third dielectric layer 118 can include depositing an oxide or nitride layer using a CVD process. Forming first cavity portion 138A can include selectively etching portions of substrate 104, ARC layer 108, stress adjusting layer 110, first dielectric layer 112, metal layer 114, and second dielectric layers 116 within contact pad region 102C. Forming second cavity portion 138B can include selectively etching portions of third dielectric layer 118, STI region 122, and IMD layer 124B through first cavity portion 138A. The selective etching processes can include using dry etching processes.

Figure 18:
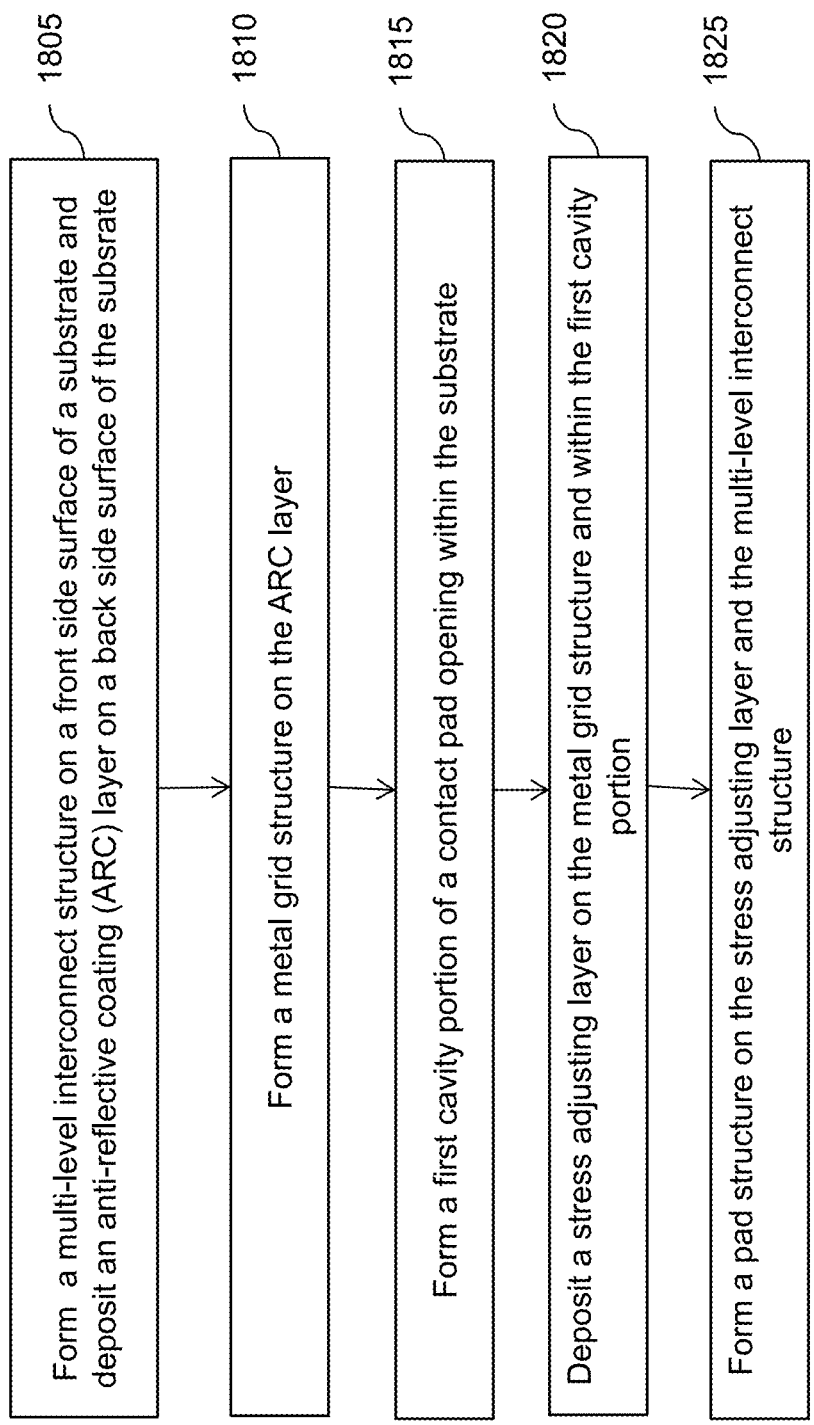
FIG. 18 is a flow diagram of a method for fabricating a BSI image sensor with a stress adjusting layer, in accordance with some embodiments.

FIG. 18 is a flow diagram of an example method 1800 for fabricating BSI image sensor 200, according to some embodiments. For illustrative purposes, the operations illustrated in FIG. 18 will be described with reference to FIGS. 19-28, which shows cross-sectional views of BSI image sensor 200 at various stages of its fabrication process, according to some embodiments. Operations can be performed in a different order or not performed depending on specific applications. It should be noted that method 600 may not produce a complete BSI image sensor 200. Accordingly, it is understood that additional processes can be provided before, during, and after method 1800, and that some other processes may only be briefly described herein. Elements in FIGS. 19-28 with the same annotations as elements in FIGS. 1A-1O and FIG. 2 are described above.

Figure 19:
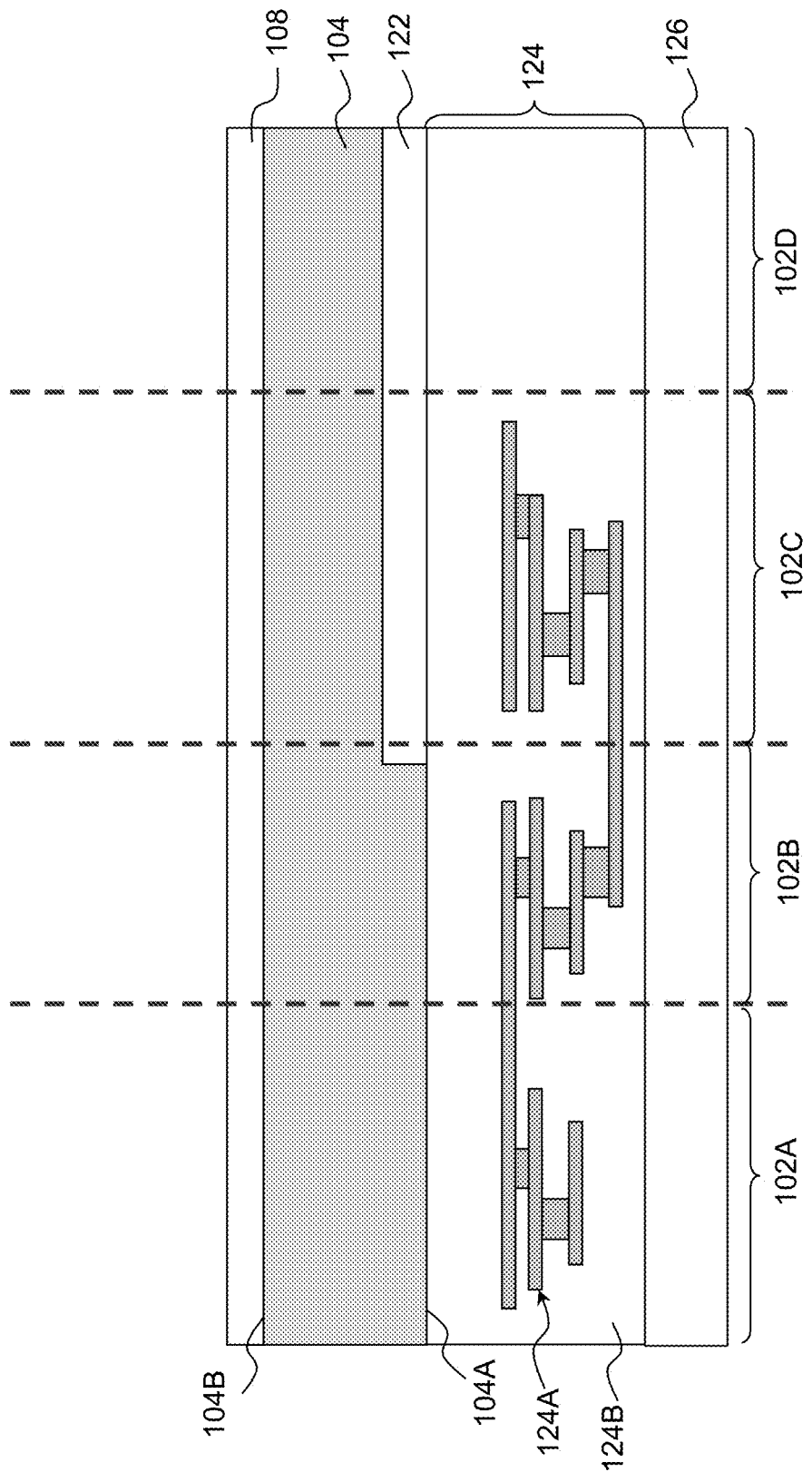
FIGS. 19-28 illustrate cross-sectional views of a BSI image sensor with a stress adjusting layer at various stages of its fabrication process, in accordance with some embodiments.

In operation 1805, similar to operation 605 of FIG. 6, a multi-level interconnect structure is formed on a front side surface of a substrate and an ARC layer is deposited on a back side surface of the substrate, as shown in FIG. 19.

Figure 20:
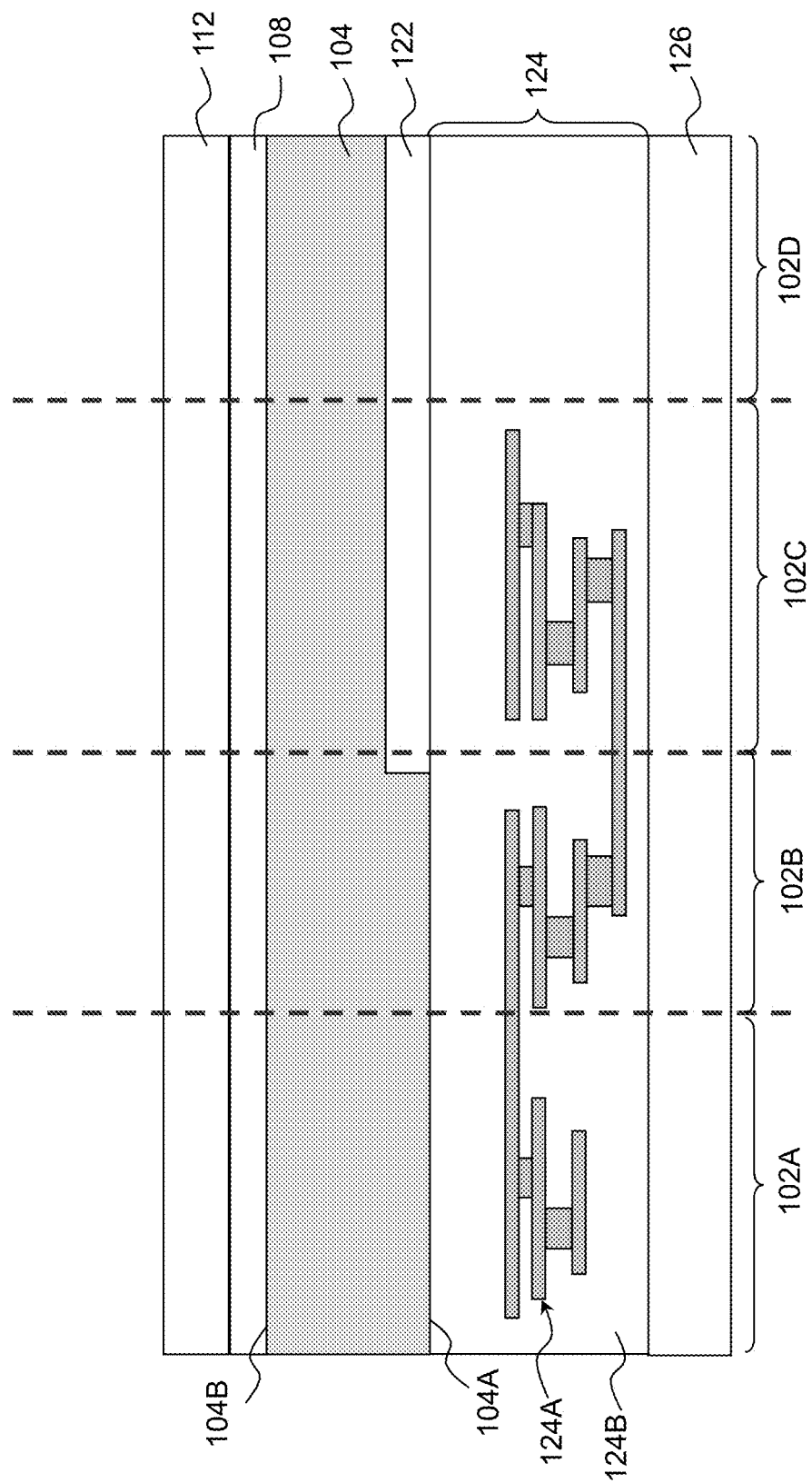
Figure 21:
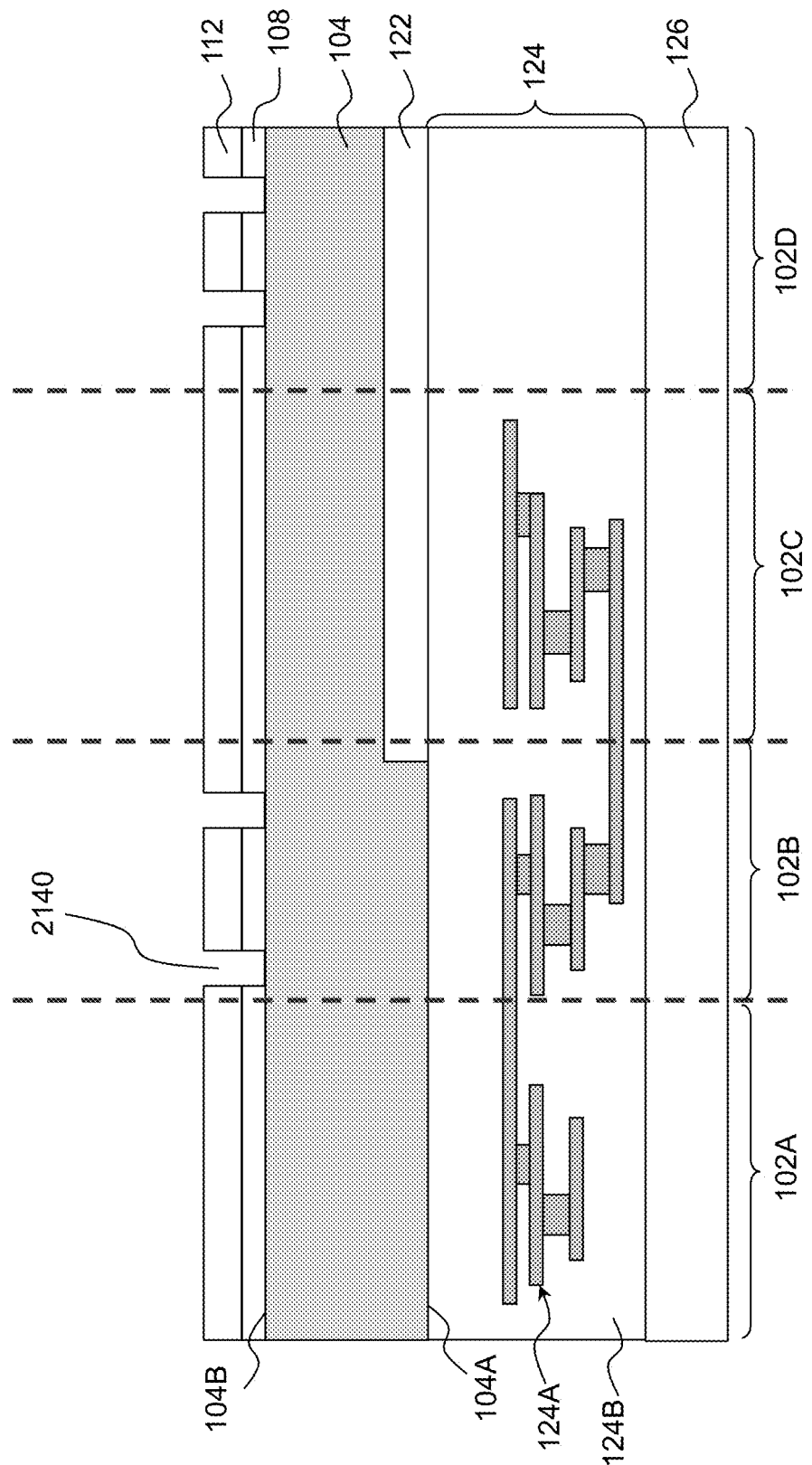
Figure 22:
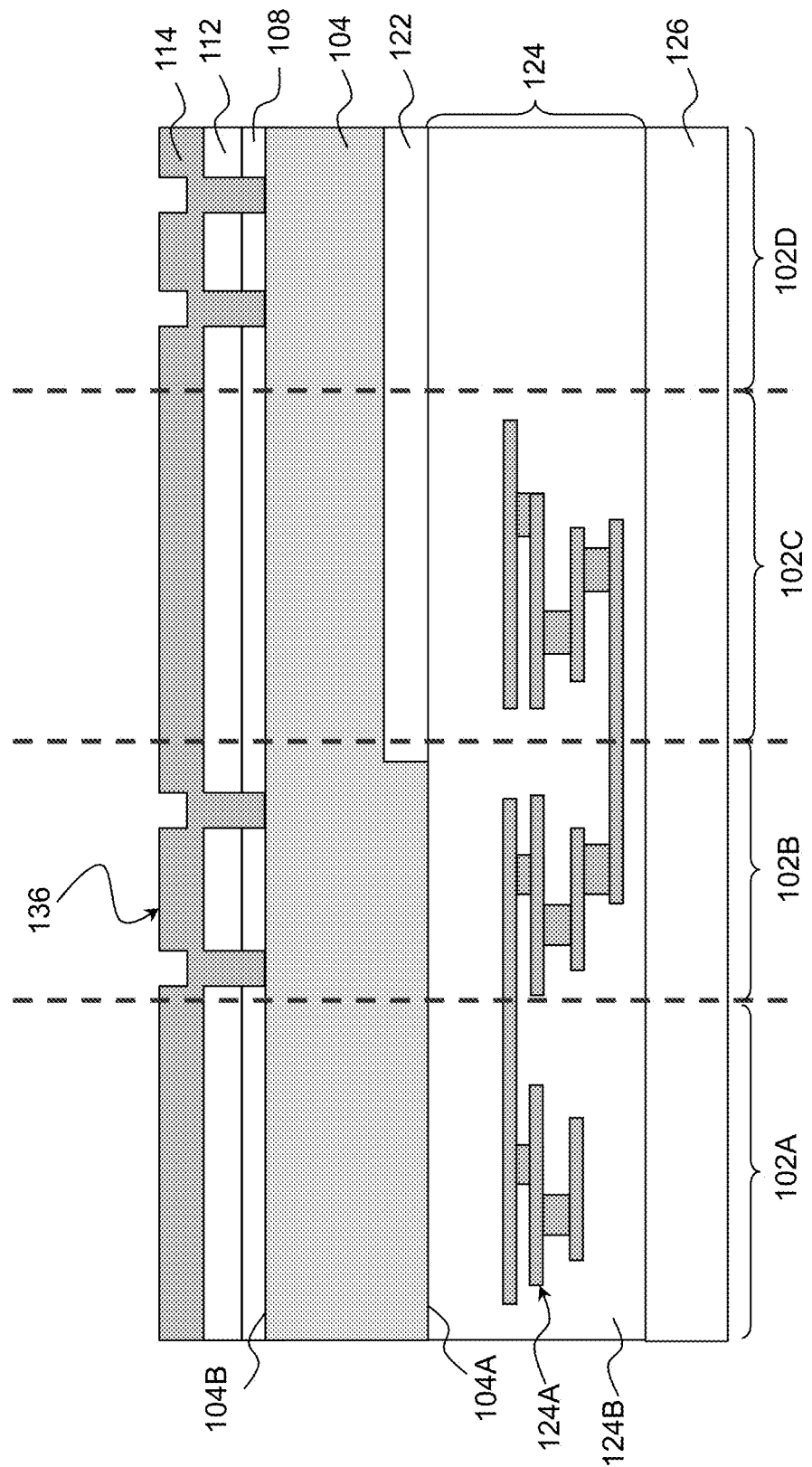
Figure 23:
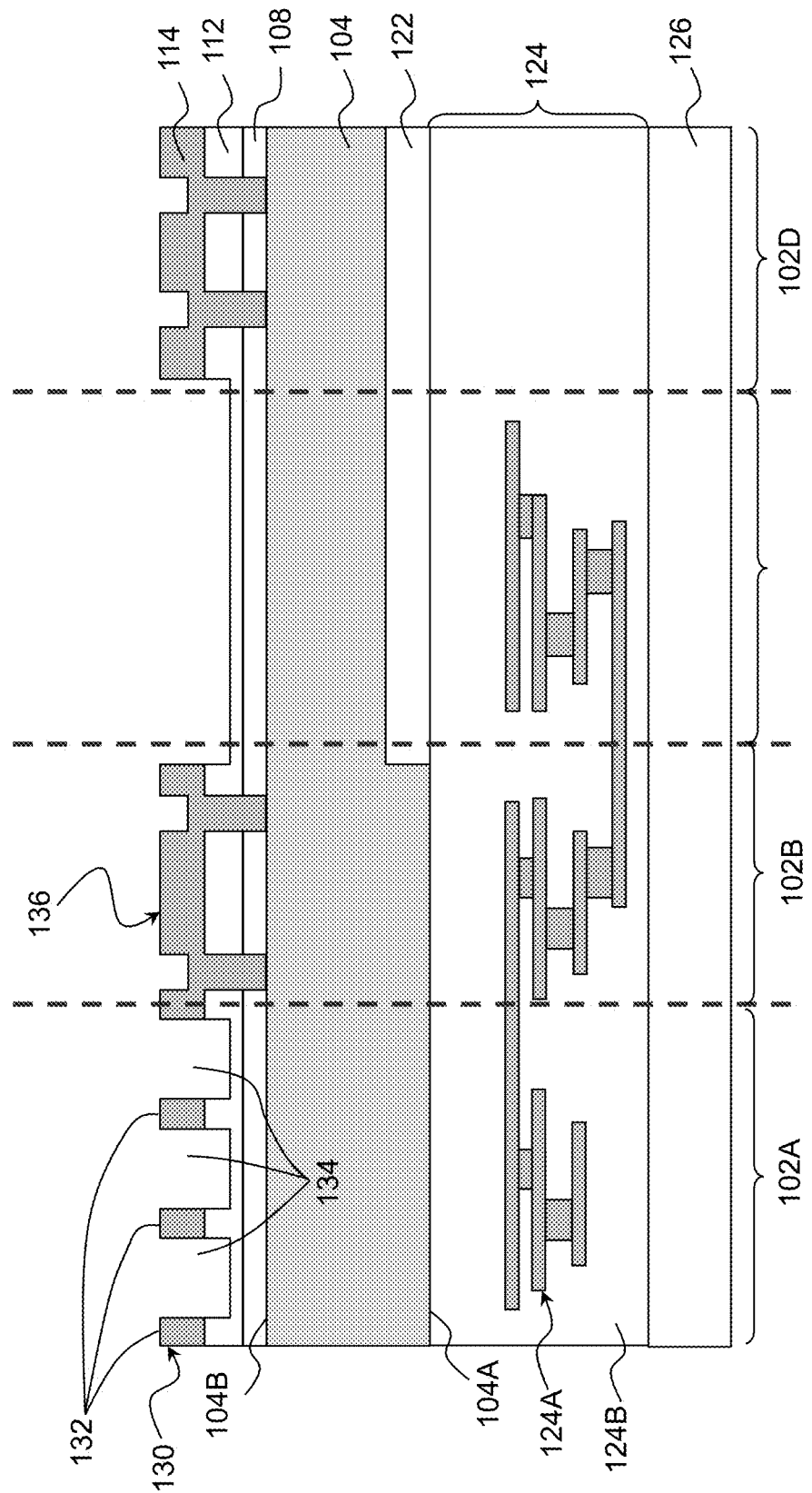

In operation 1810, a metal grid structure is formed on the ARC layer. For example, as shown in FIG. 23, metal grid structure 130 can be formed on ARC layer 108. The formation of metal grid structure 130 can include sequential operations of (i) depositing first dielectric layer 112 on ARC layer 108, as shown in FIG. 20; (ii) forming openings 2140 within the stack of ARC layer 108 and first dielectric layer 112, as shown in FIG. 21; (iii) depositing metal layer 114 on first dielectric layer 112, as shown in FIG. 22; and (iv) patterning and etching metal layer 114 and first dielectric layer 112 to form grid lines 132 and pixels 134, as shown in FIG. 23. In some embodiments, depositing first dielectric layer 112 can include depositing an oxide layer using a PECVD process. In some embodiments, depositing metal layer 114 can include depositing a layer of aluminum (Al), copper (Cu), tantalum (Ta), titanium (Ti), a combination thereof, or other suitable metallic materials on first dielectric layer 112.

Figure 24:
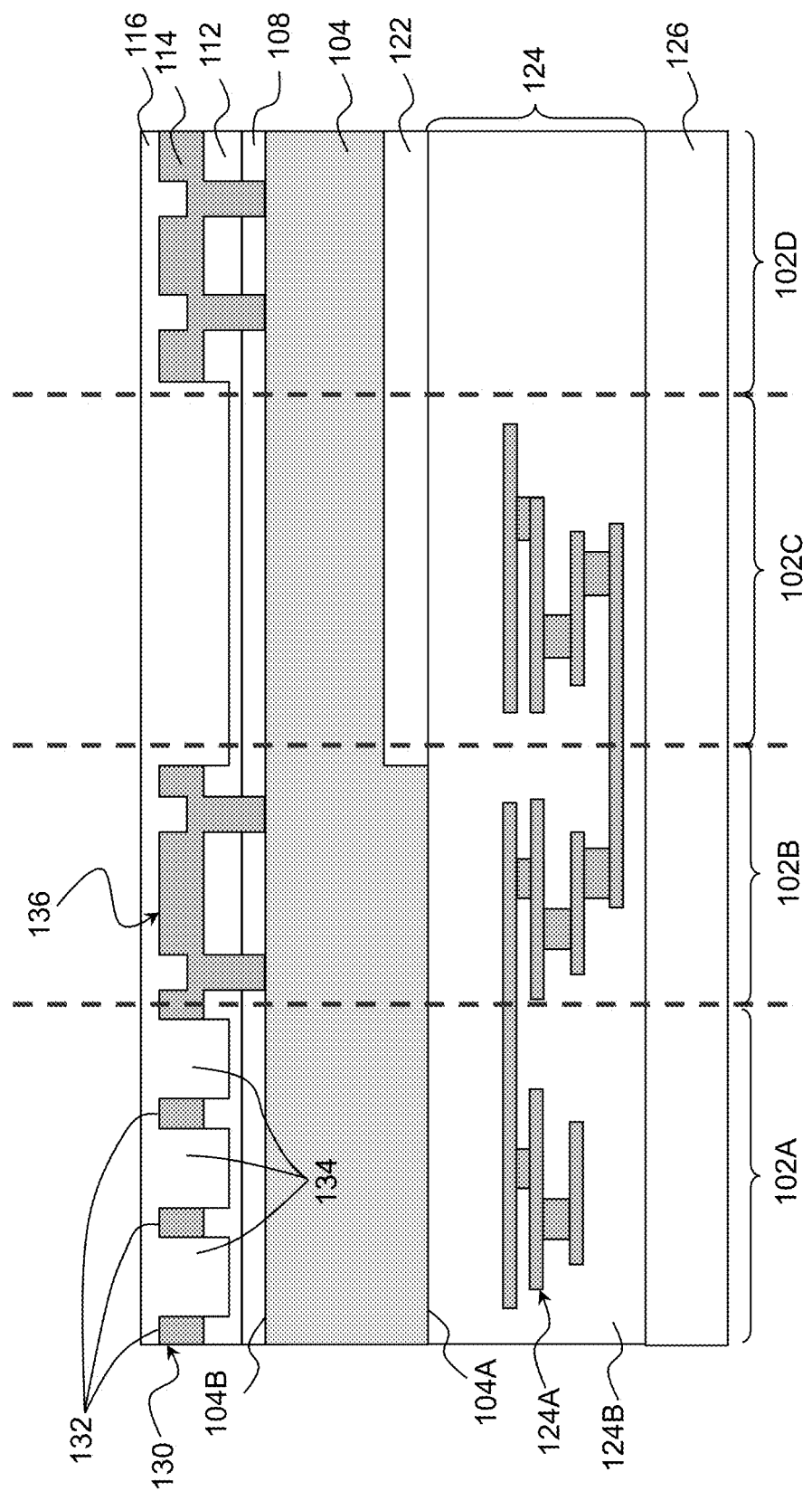
Figure 25:
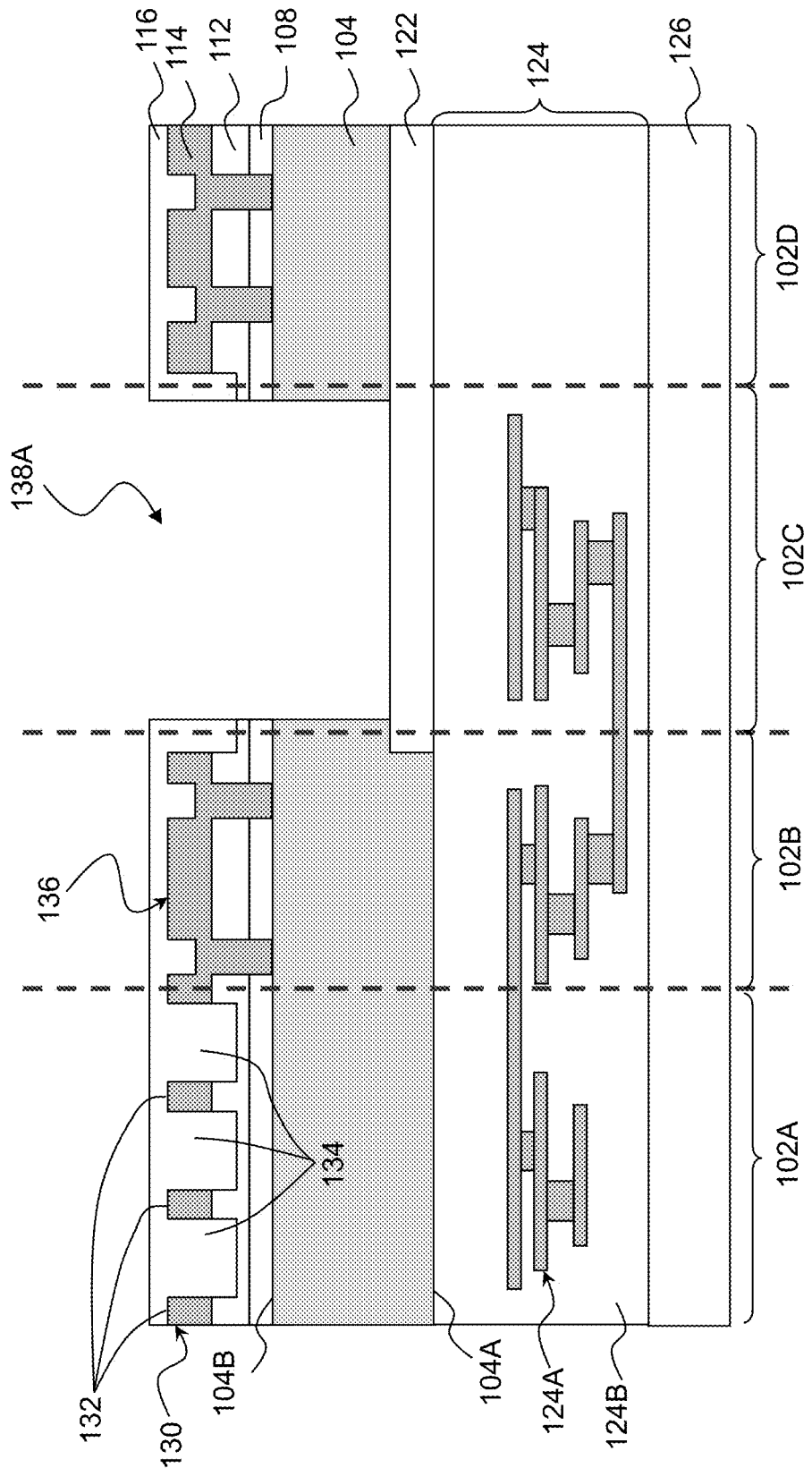

In operation 1815, a first cavity portion of a contact pad opening is formed within the substrate. For example, as shown in FIG. 25, first cavity portion 138A of contact pad opening 138 can be formed on STI region 122. The formation of first cavity portion 138A can include sequential operations of (i) depositing second dielectric layer 116 on the structure of FIG. 23, as shown in FIG. 24 and (ii) selectively etching portions of substrate 104, ARC layer 108, first dielectric layer 112, metal layer 114, and second dielectric layers 116 within contact pad region 102C, as shown in FIG. 25. In some embodiments, depositing second dielectric layer 116 can include depositing an oxide layer using a PECVD process and the selective etching process can include using dry etching processes.

Figure 26:
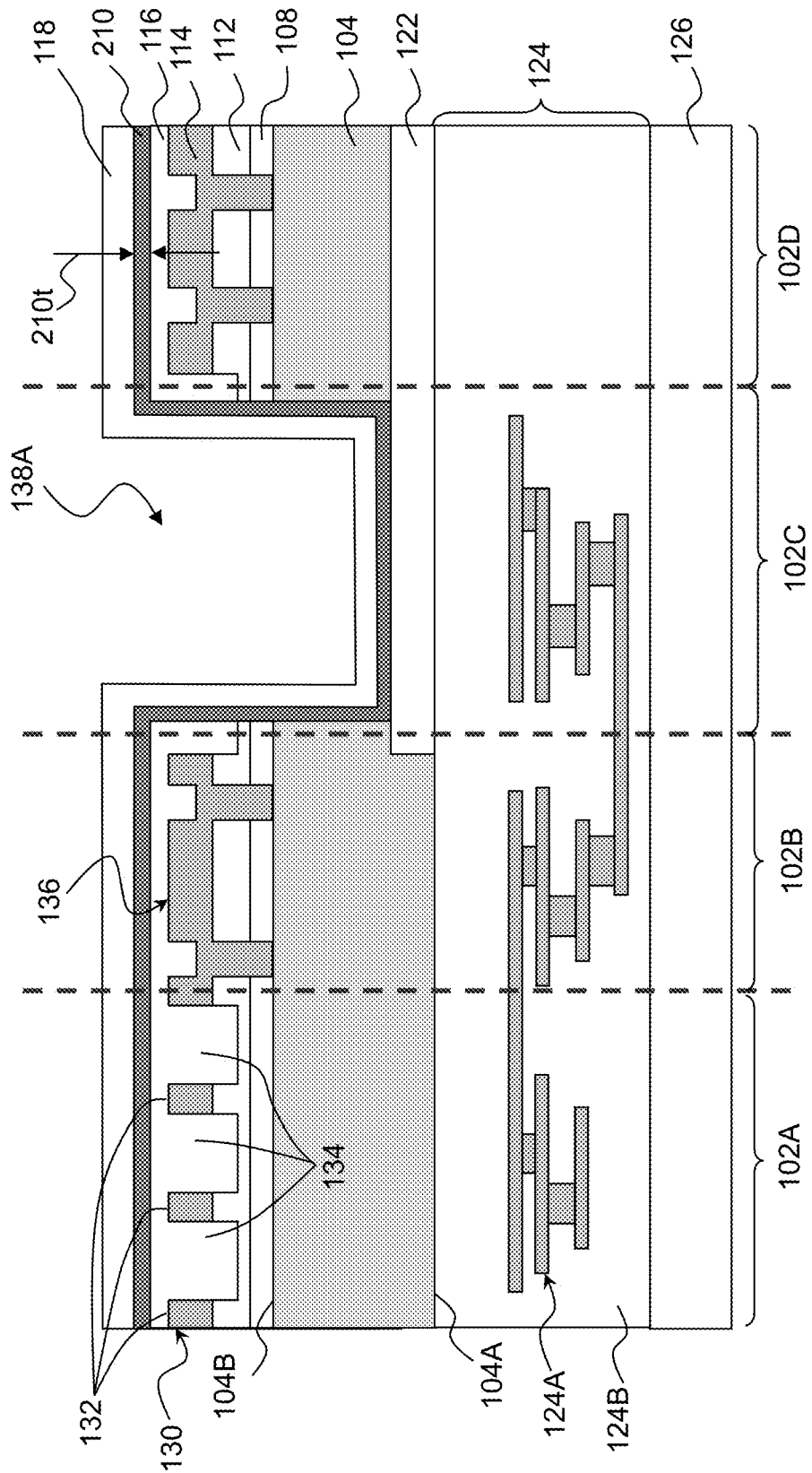

In operation 1820, a stress adjusting layer is deposited on the metal grid structure and within the first cavity portion. For example, as shown in FIG. 26, stress adjusting layer 210 can be deposited on the structure of FIG. 25 in an operation similar to operation 610.

Figure 27:
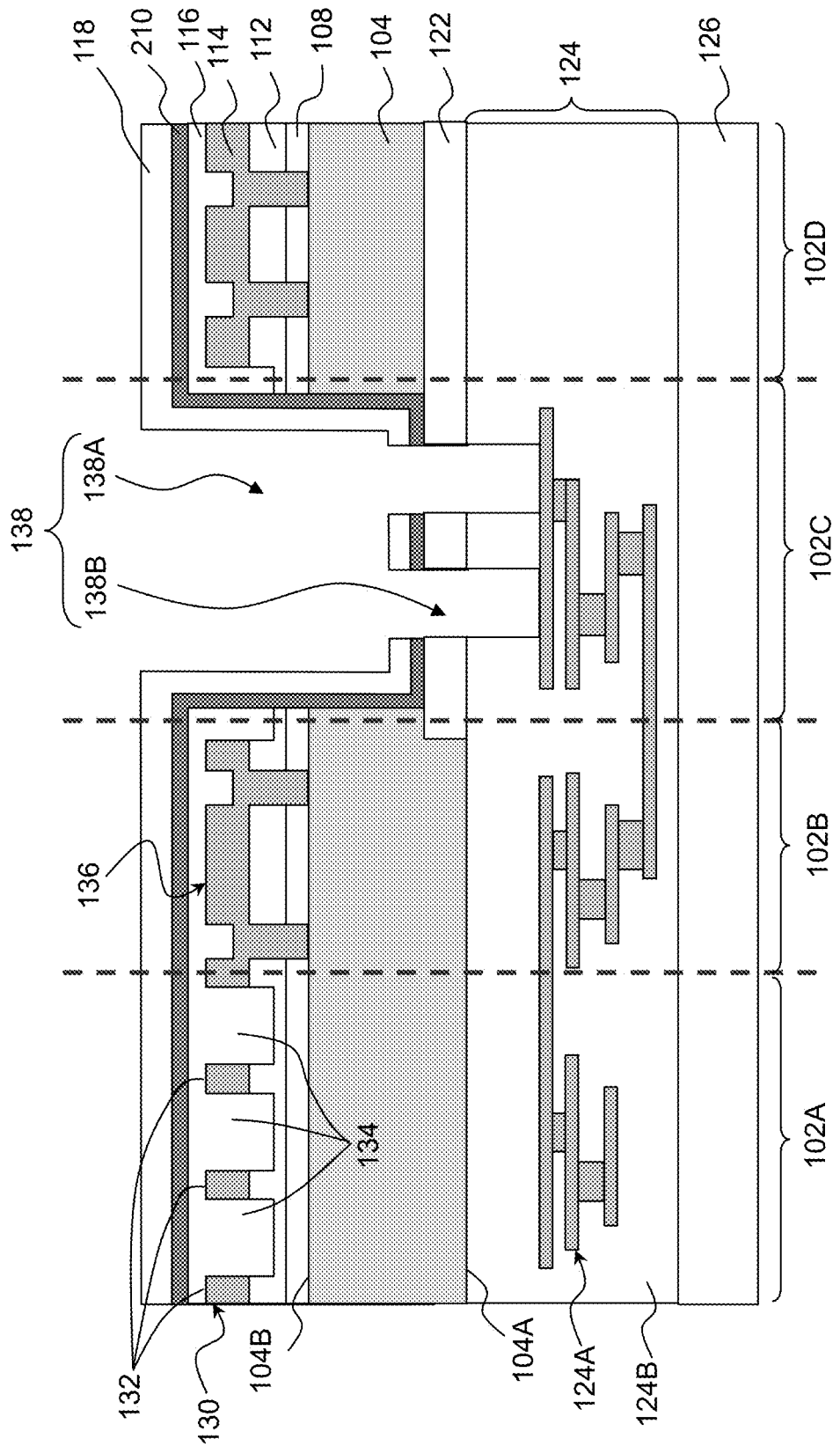
Figure 28:
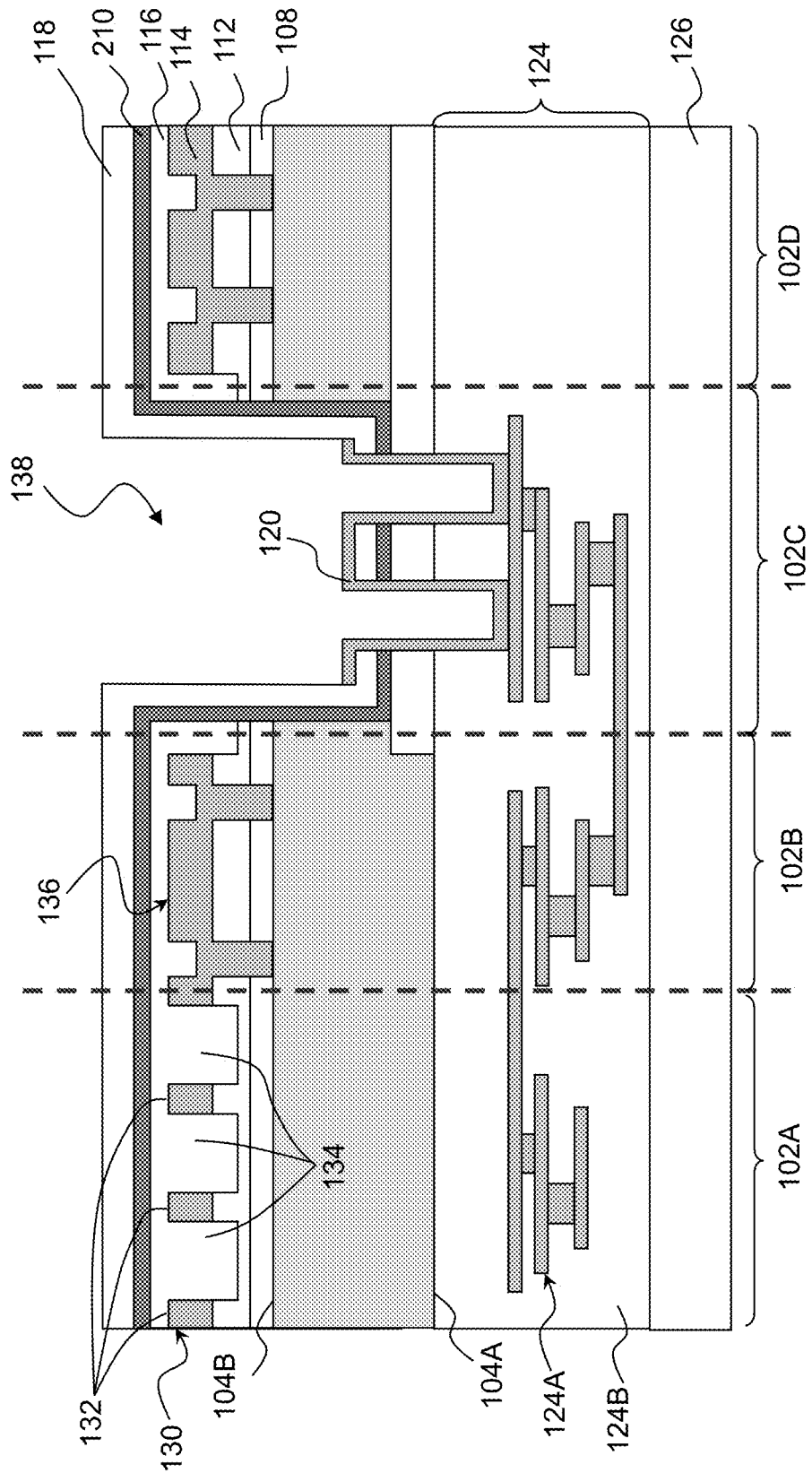

In operation 1825, a pad structure on the stress adjusting layer and the multi-level interconnect structure. For example, as shown in FIG. 28, pad structure 120 can be formed on stress adjusting layer 210 and multi-level interconnect structure 124A. The formation of pad structure 120 can include sequential operations of (i) depositing third dielectric layer 118 on stress adjusting layer 210, as shown in FIG. 26; (ii) forming a second cavity portion 138B, as shown in FIG. 27; (v) depositing a conductive layer on the structure of FIG. 27; and (vi) patterning and etching the conductive layer to form pad structure 120 within contact pad opening 138, as shown in FIG. 28. In some embodiments, depositing third dielectric layer 118 can include depositing an oxide or nitride layer using a CVD process. Forming second cavity portion 138B can include selectively etching portions of stress adjusting layer 210, third dielectric layer 118, STI region 122, and IMD layer 124B through first cavity portion 138A. The selective etching processes can include using dry etching processes.

In some embodiments, BSI image sensor 300 can be fabricated by incorporating operation 610 of method 600 between operations 1805 and 1810 of method 1800.

Figure 29:
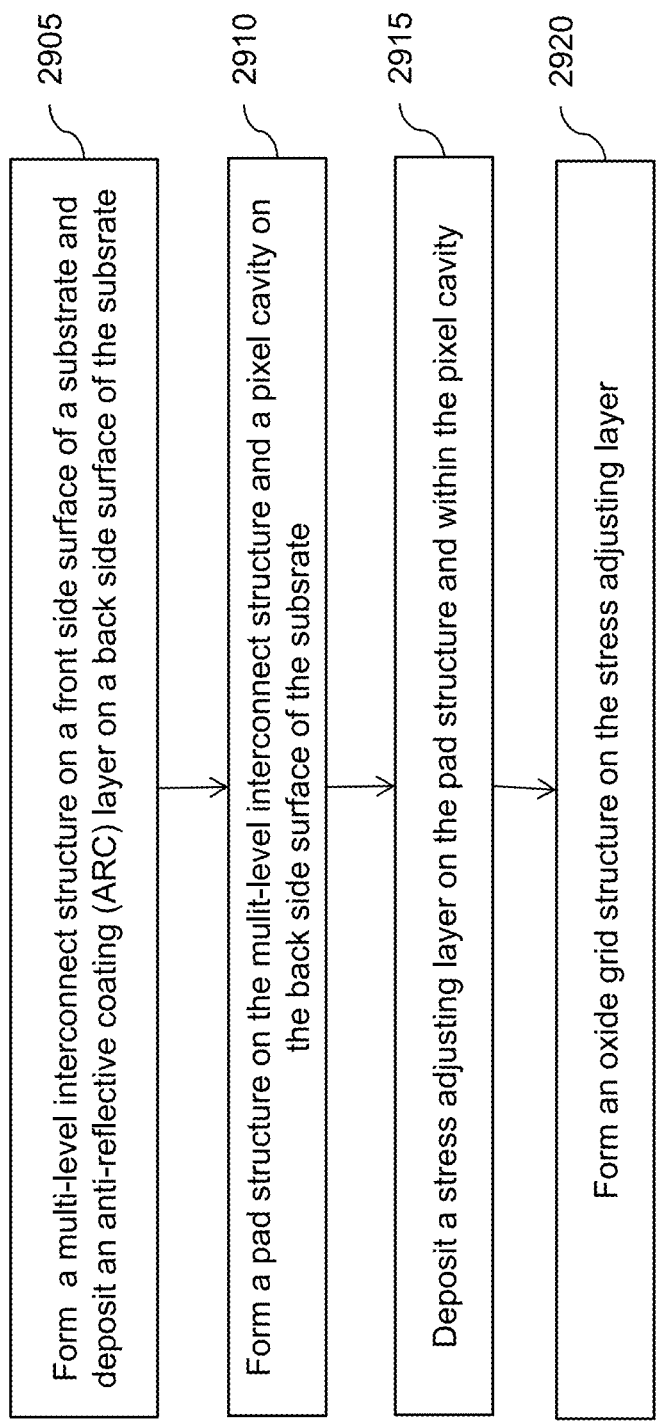
FIG. 29 is a flow diagram of a method for fabricating a BSI image sensor with a stress adjusting layer, in accordance with some embodiments.

FIG. 29 is a flow diagram of an example method 2900 for fabricating BSI image sensor 400, according to some embodiments. For illustrative purposes, the operations illustrated in FIG. 29 will be described with reference to FIGS. 30-38, which shows cross-sectional views of BSI image sensor 400 at various stages of its fabrication process, according to some embodiments. Operations can be performed in a different order or not performed depending on specific applications. It should be noted that method 600 may not produce a complete BSI image sensor 400. Accordingly, it is understood that additional processes can be provided before, during, and after method 2900, and that some other processes may only be briefly described herein. Elements in FIGS. 30-38 with the same annotations as elements in FIGS. 1A-1O and FIG. 4 are described above.

Figure 30:
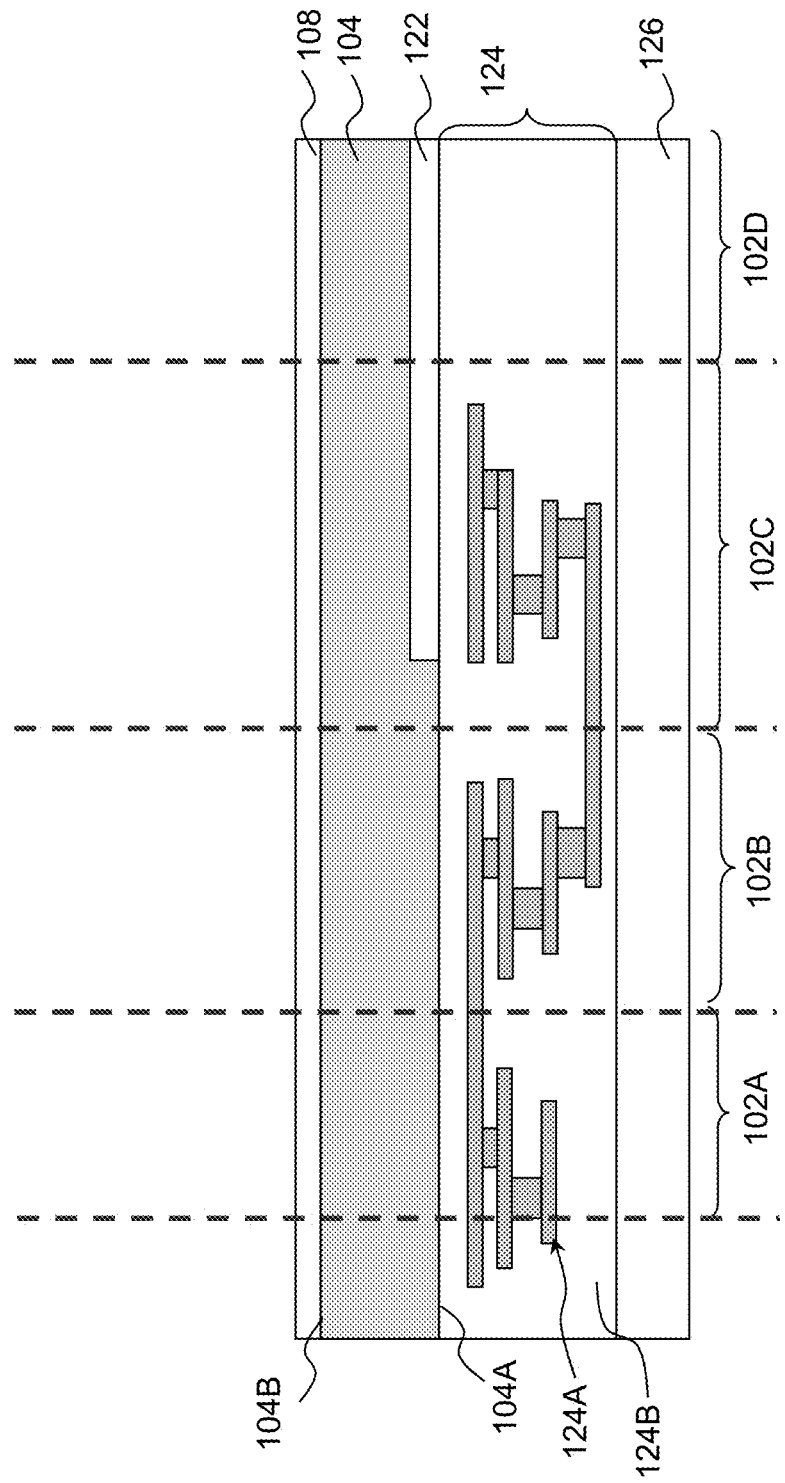
FIGS. 30-38 illustrate cross-sectional views of a BSI image sensor with a stress adjusting layer at various stages of its fabrication process, in accordance with some embodiments.

In operation 2905, similar to operation 605 of FIG. 6, a multi-level interconnect structure is formed on a front side surface of a substrate and an ARC layer is deposited on a back side surface of the substrate, as shown in FIG. 30.

Figure 31:
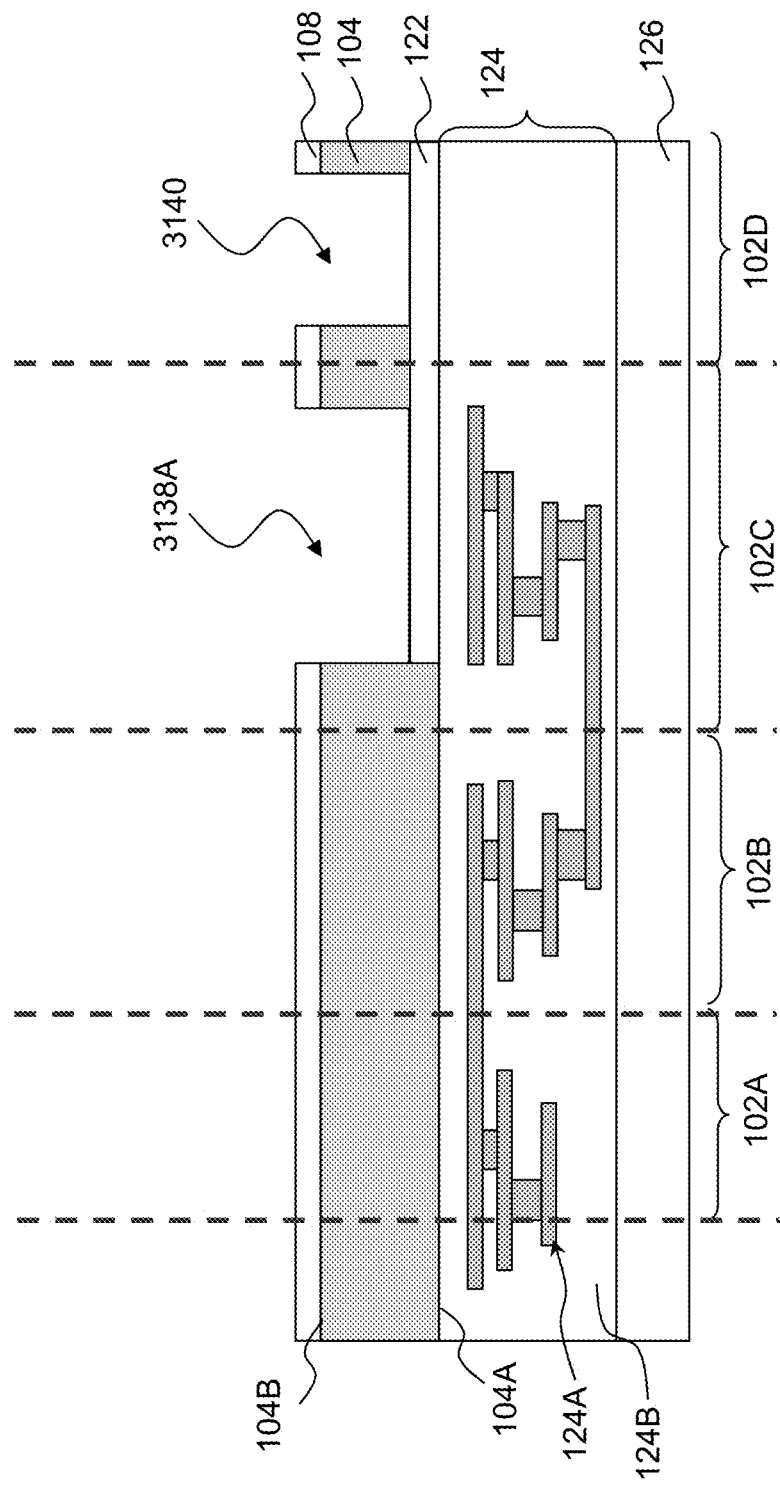
Figure 32:
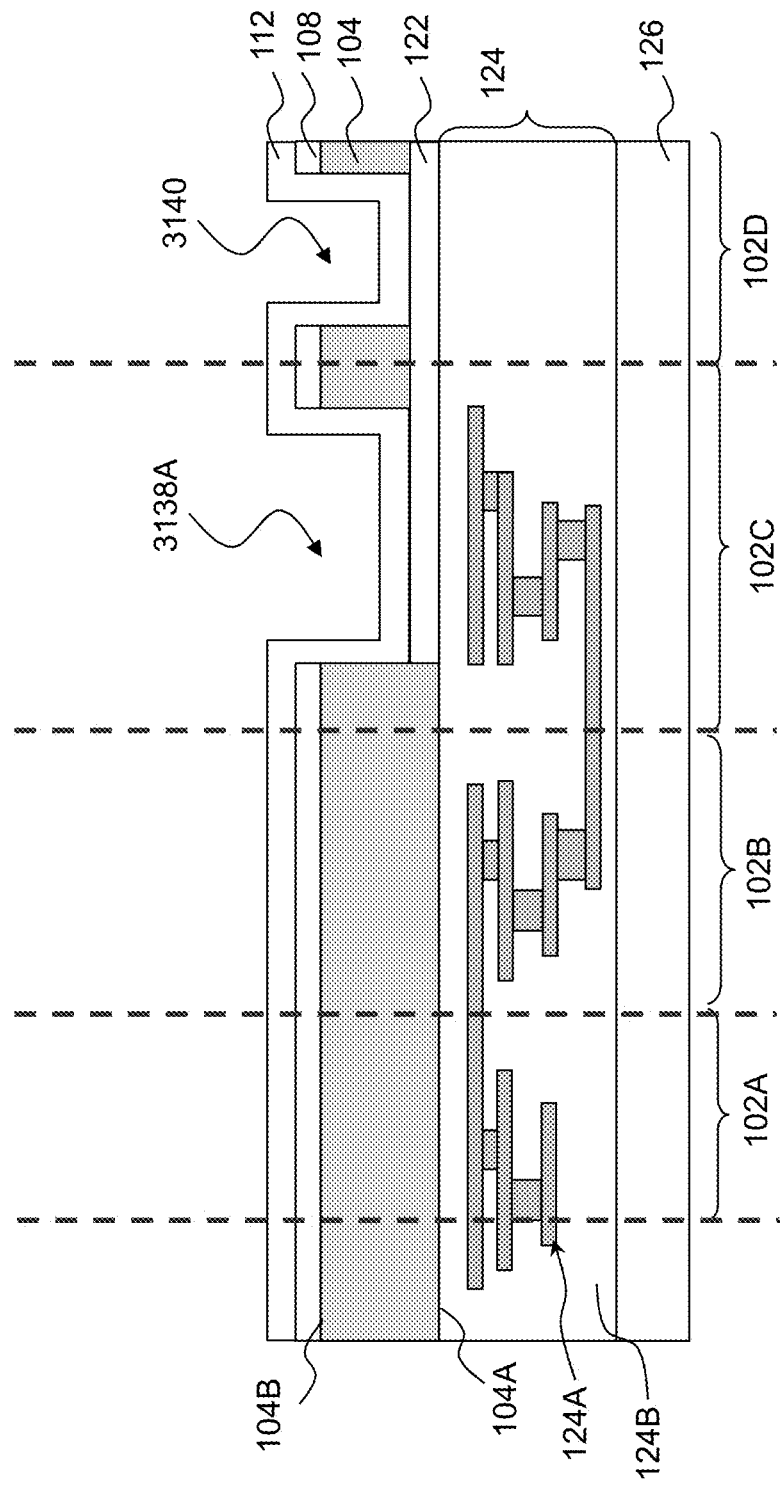
Figure 33:
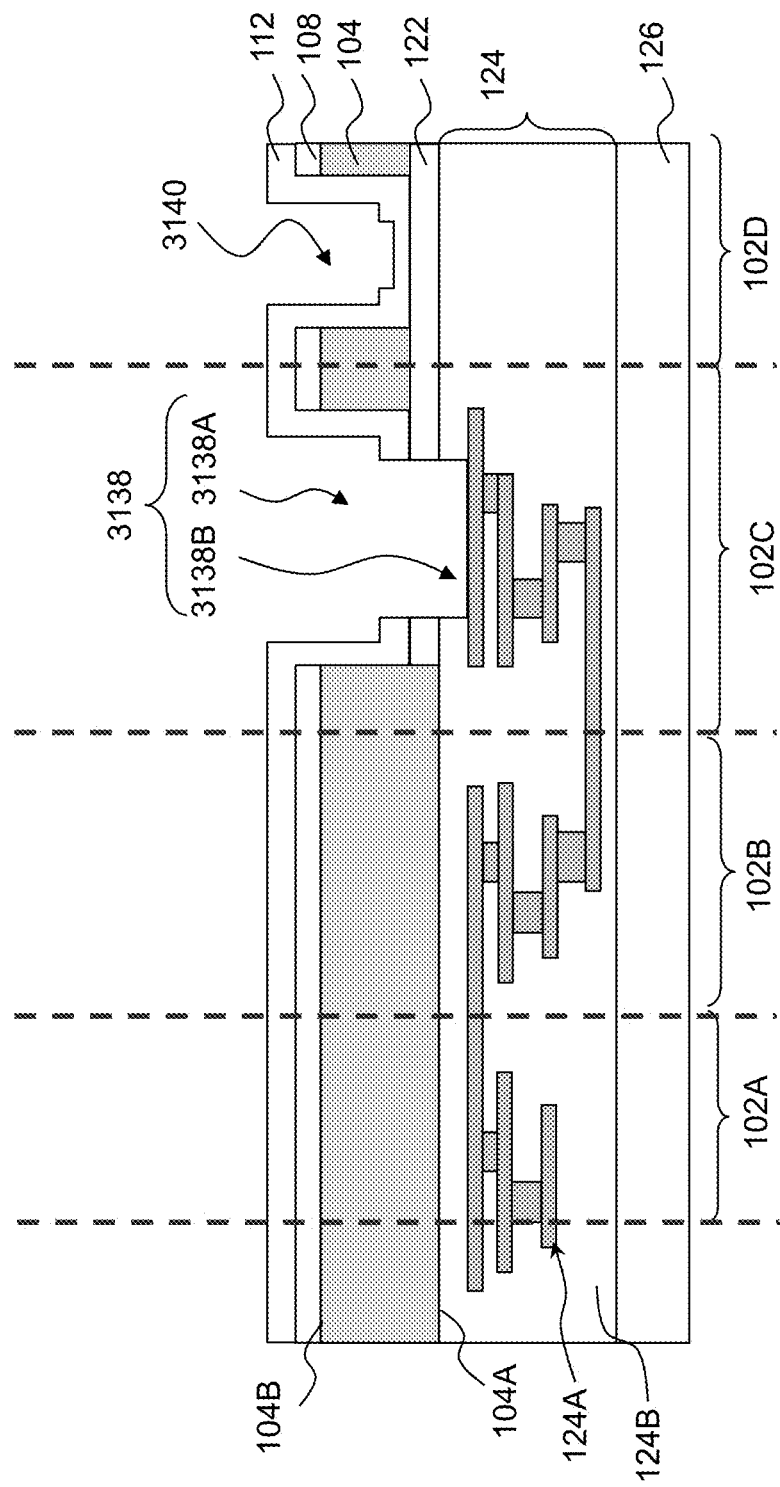
Figure 34:
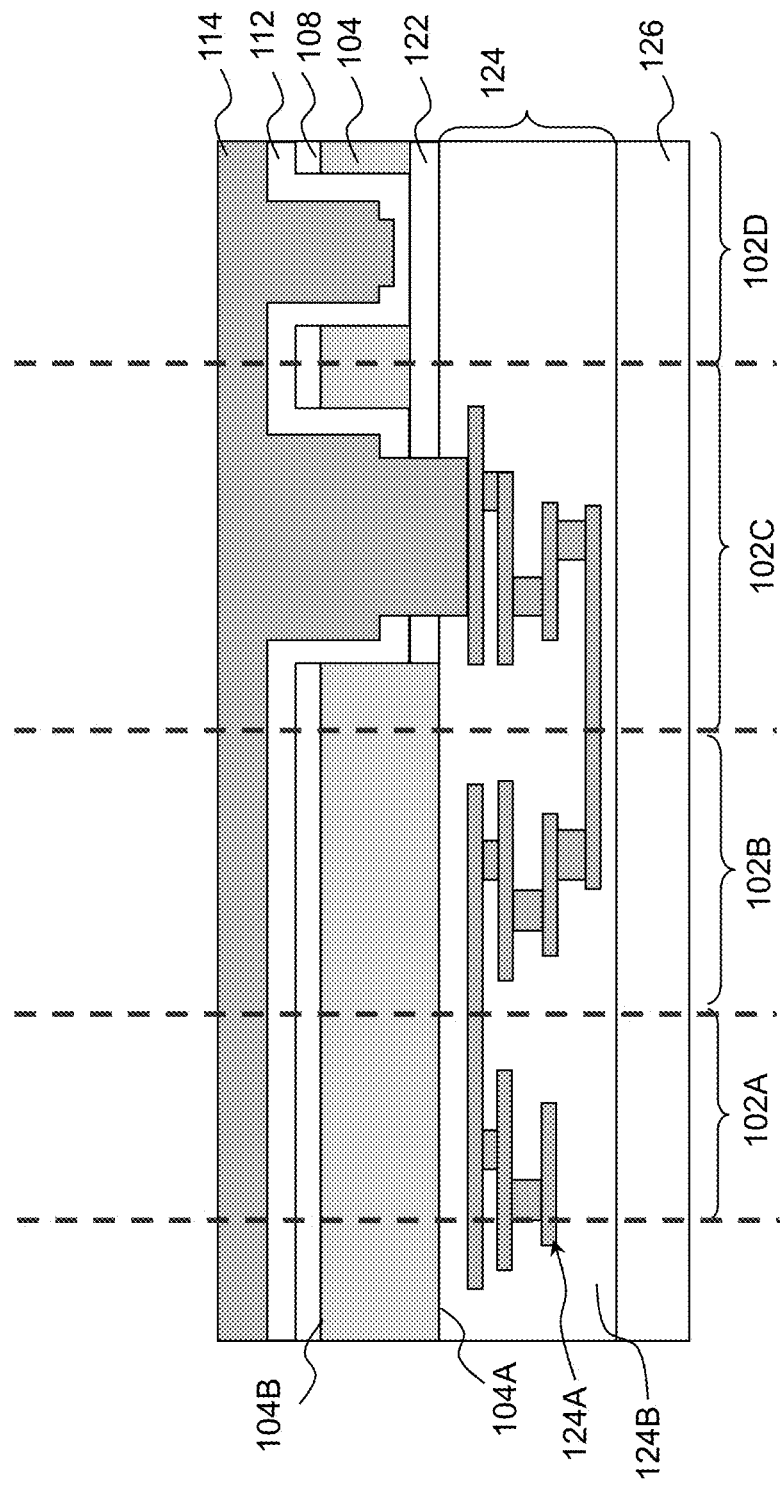
Figure 35:
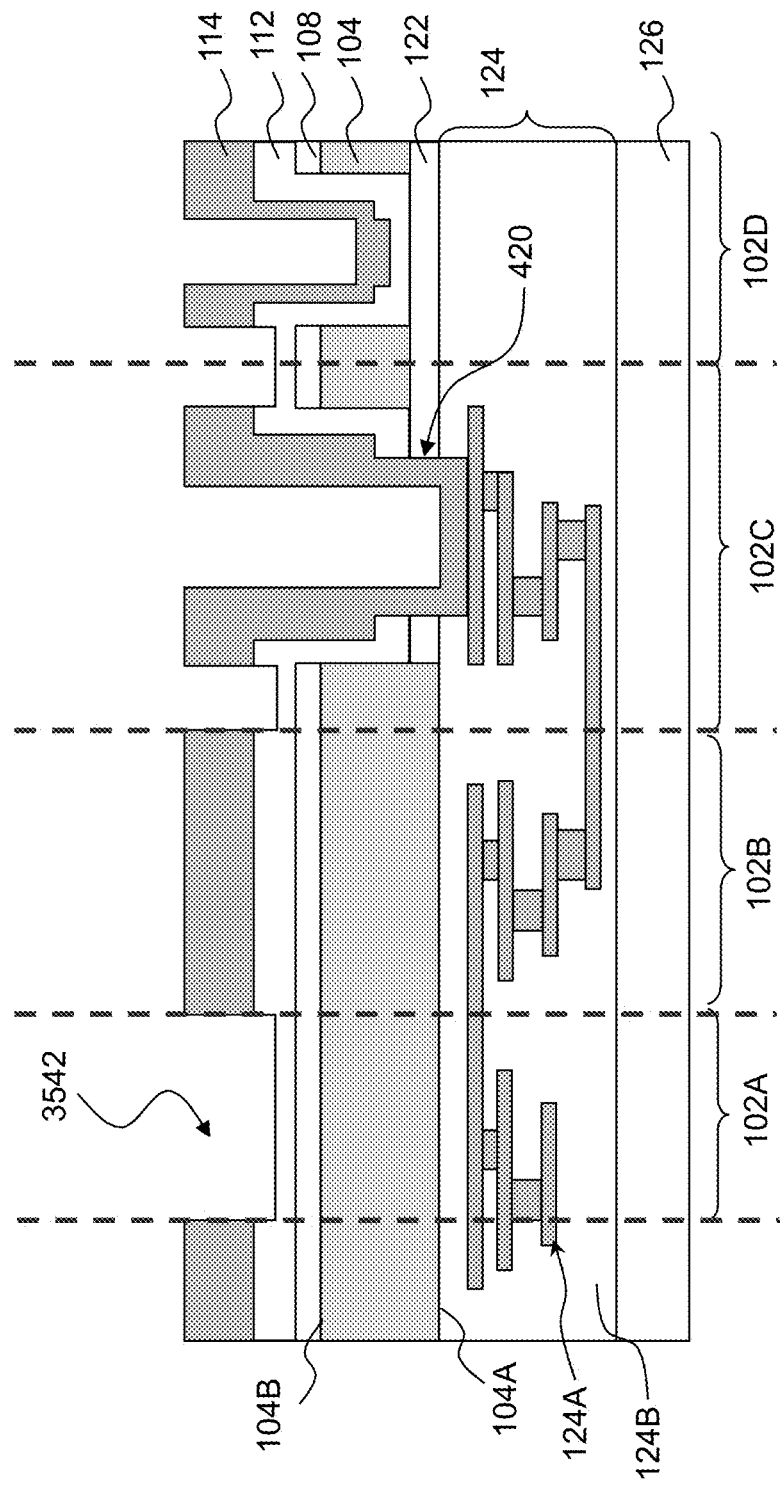

In operation 2910, a pad structure is formed on the multi-level interconnect structure and a pixel cavity is formed on the back side surface of the substrate. For example, as shown in FIG. 35, pad structure 420 can be formed on multi-level interconnect structure 124A and a pixel cavity 3542 can be formed on back side surface 104B. The formation of pad structure 420 can include sequential operations of (i) forming a first cavity portion 3138A of contact pad opening 3138 and a BSL opening 3140 within substrate 104 through back side surface 104B, as shown in FIG. 31; (ii) depositing first dielectric layer 112 on the structure of FIG. 31, as shown in FIG. 32; (iii) forming a second cavity portion 3138B of contact pad opening 3138 through first dielectric layer 112, STI region 122, and IMD layer 124B, as shown in FIG. 33; (iv) depositing metal layer 114 on the structure of FIG. 33 to fill contact pad opening 3138, as shown in FIG. 34; and (v) patterning and etching the portion of metal layer 114 within contact pad opening 3138, as shown in FIG. 35. The formation of pad structure 420 can be followed by patterning and etching the portion of metal layer 114 within pixel region 102A to form pixel cavity 3542.

In some embodiments, depositing second first dielectric layer 112 can include depositing an oxide layer using a PECVD process. Forming first cavity portion 3138A can include selectively etching portions of substrate 104 and ARC layer 108 within contact pad region 102C. Forming second cavity portion 3138B can include selectively etching portions of first dielectric layer 112, STI region 122, and IMD layer 124B through first cavity portion 3138A. The selective etching processes can include using dry etching processes. In some embodiments, depositing metal layer 114 can include depositing a layer of aluminum (Al), copper (Cu), tantalum (Ta), titanium (Ti), a combination thereof, or other suitable metallic materials on the structure of FIG. 33.

Figure 36:
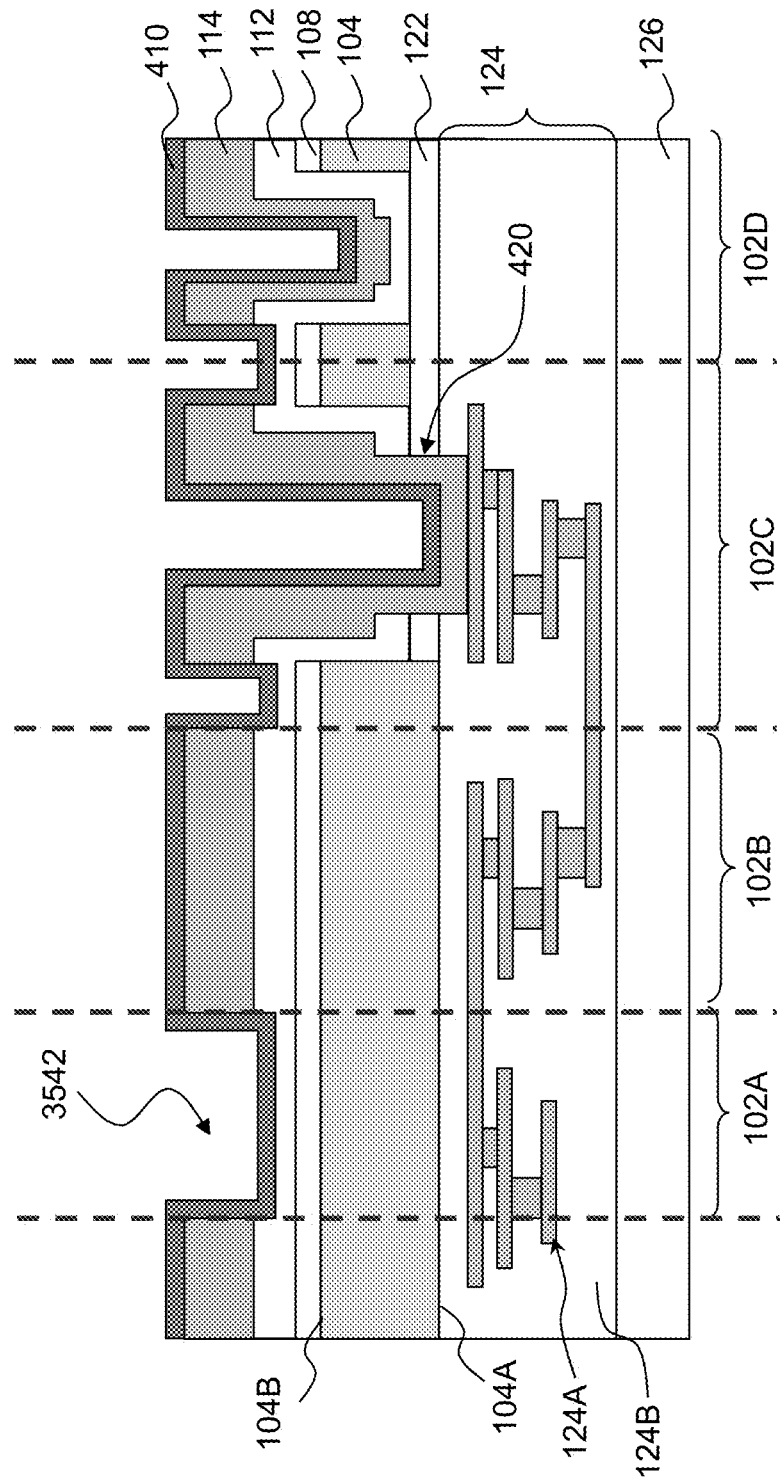
Figure 37:
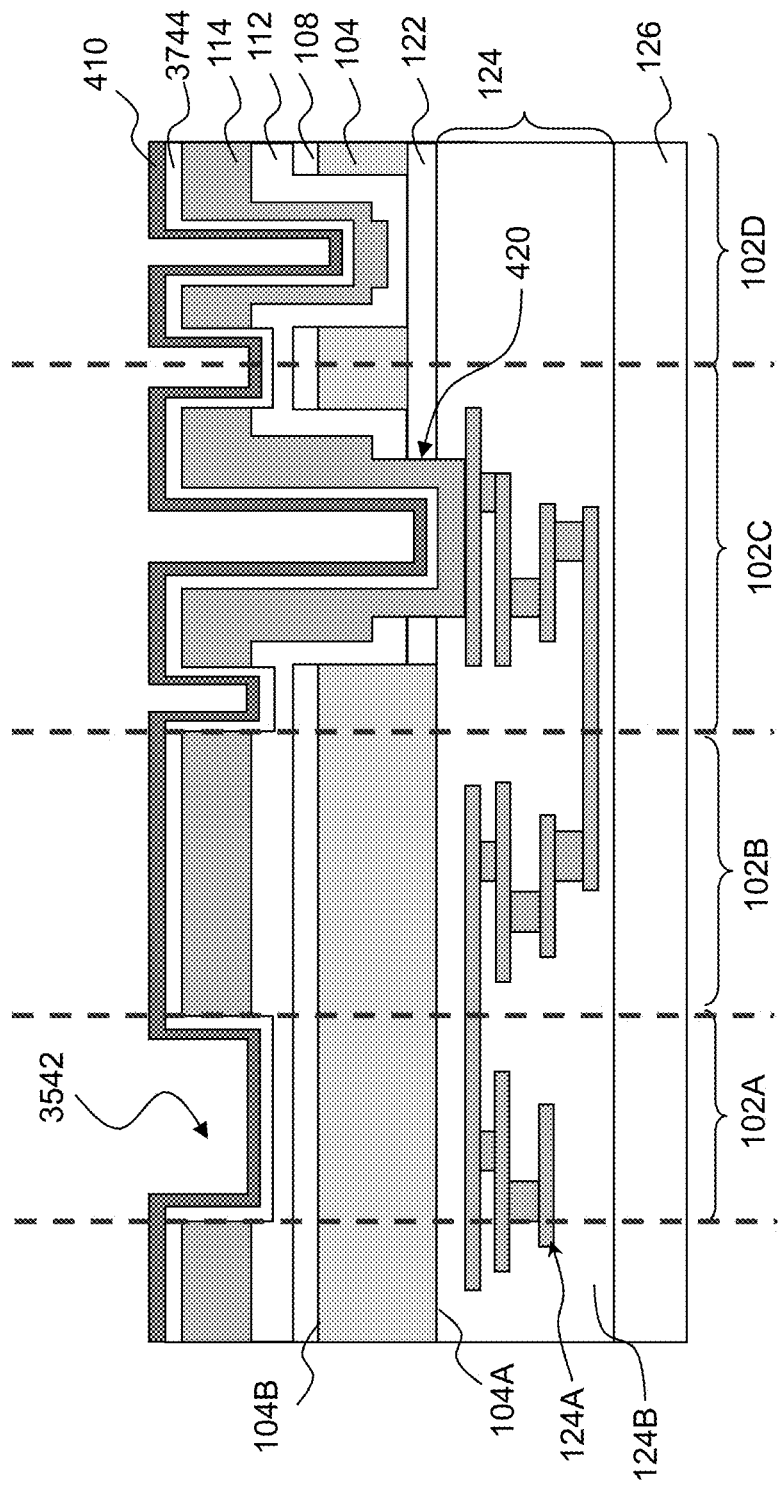

In operation 2915, a stress adjusting layer is deposited on the pad structure and within the pixel cavity. For example, as shown in FIG. 36, stress adjusting layer 410 can be deposited on the structure of FIG. 35 in an operation similar to operation 610. In some embodiments, a passivation layer 3744 can be deposited on the structure of FIG. 35 prior to the deposition of stress adjusting layer 410, as shown in FIG. 37. In some embodiments, passivation layer 3744 can include an oxide layer, a nitride layer, a combination thereof, or other suitable dielectric materials.

Figure 38:
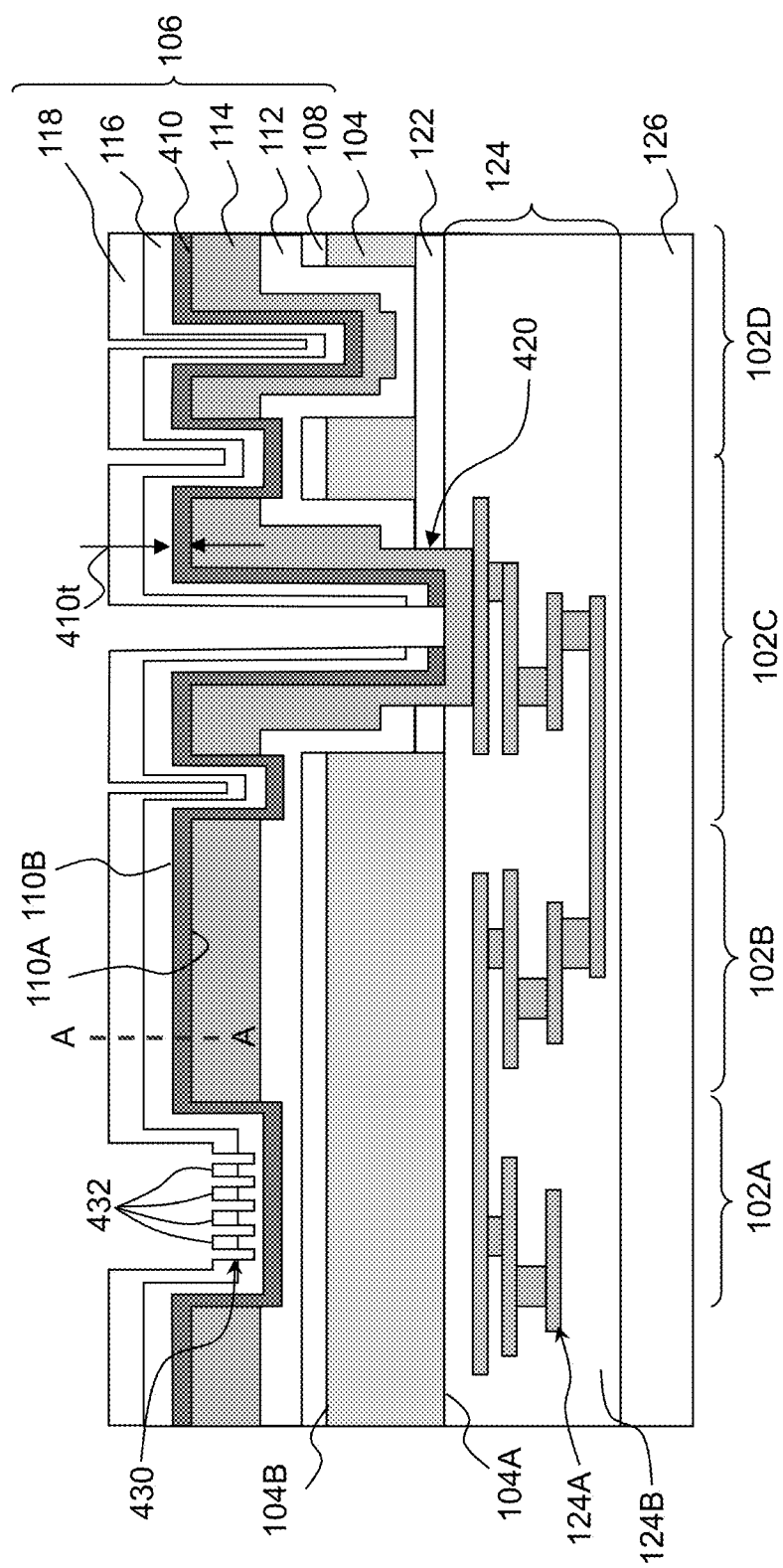

In operation 2920, an oxide grid structure is formed on the stress adjusting layer. For example, as shown in FIG. 38, oxide grid structure 430 can be formed on stress adjusting layer 410. The formation of oxide grid structure 430 can include sequential operations of (i) depositing second dielectric layer 116 on the structure of FIG. 37; (ii) depositing third dielectric layer 118 on second dielectric layer 116; and (iii) patterning and etching second and third dielectric layers 116 and 118 to form grid lines 432 and pixels 434, as shown in FIG. 38. In some embodiments, depositing second dielectric layer 116 can include depositing an oxide layer using a PECVD process and depositing third dielectric layer 118 can include depositing an oxide or nitride layer using a CVD process.

In some embodiments, BSI image sensor 500 can be fabricated by incorporating operation 610 of method 600 between operations 2905 and 2910 of method 2900.

The present disclosure provides example BSI image sensors (e.g., BSI image sensors 100-500) with stress adjusting layers (e.g., stress adjusting layers 110, 210, 410, and 510) and example methods for fabricating the same. The stress adjusting layers are disposed within the stack of layers in the pixel region (e.g., pixel region 102A) and/or other regions (e.g., contact pad region, metal shield region, etc.) of the BSI image sensors. The stress adjusting layers are configured to induce stress to counteract the residual stress within the stack of layers. For example, the stress adjusting layers induce compressive stress to counteract tensile stress in the underlying and/or overlying layers or induce tensile stress to counteract compressive stress in the underlying and/or overlying layers. Such counteracting stress induced by the stress adjusting layers relaxes the residual stress within the stack of layers, thus preventing the formation of stress induced cracks within the stack of layers and/or the stress induced peeling of layers from the substrate. The use of the stress adjusting layers in the BSI image sensors can increase device reliability by about 40% to about 50% compared to BSI image sensors without the stress adjusting layers.

In some embodiments, the stress adjusting layers can be disposed above and/or below the grid structure (e.g., grid structures 130 and 430) in the pixel regions. The stress adjusting layers can be disposed on an anti-reflective coating (ARC) layer (e.g., ARC layer 108) below the grid structure and/or interposed between the color filtering layers above the grid structure. In some embodiments, the stress adjusting layers can include a silicon-rich oxide layer with a linear or graded Si concentration profile and a constant or graded silicon-to-oxygen ratio across the silicon-rich oxide layer. In some embodiments, the stress adjusting layers can include a bi-layer structure (e.g., bi-layer structure 110 with bottom layer 110C and top layer 110D) with a silicon-rich oxide bottom layer and an oxide or nitride top layer. The bi-layer structure can include a constant or graded Si concentration profile and a constant or graded silicon-to-oxygen ratio across the bi-layer structure.

In some embodiments, a semiconductor device includes a substrate with a first surface and a second surface opposite to the first surface, an anti-reflective coating (ARC) layer disposed on the second surface of the substrate, and a stress adjusting layer disposed on the ARC layer. The stress adjusting layer includes an oxide of a semiconductor material. The concentration profiles of the semiconductor material and oxygen atoms in the stress adjusting layer are non-overlapping and different from each other. The semiconductor device further includes a grid structure disposed on the stress adjusting layer and a metallization layer disposed on the first surface of the substrate.

In some embodiments, an image sensor includes a substrate with a front side surface and a back side surface opposite to the front side surface, an anti-reflective coating (ARC) layer disposed on the back side surface of the substrate, a dielectric layer disposed on the ARC layer, a metal layer disposed on the dielectric layer, and a stress adjusting layer disposed on the metal layer. The stress adjusting layer includes a silicon-rich oxide layer. The concentration profiles of silicon and oxygen atoms in the stress adjusting layer are non-overlapping and different from each other. The image sensor further includes oxide grid structure disposed on the stress adjusting layer.

In some embodiments, a method includes forming a metallization layer on a front side surface of a substrate, depositing a high-k dielectric layer on a back side surface of the substrate, and depositing a stress adjusting layer on the ARC layer. The depositing the stress adjusting layer includes depositing a silicon-rich oxide layer with a silicon-to-oxygen concentration ratio profile having a decreasing slope from a bottom surface to a top surface of the stress adjusting layer. The method further includes forming a pixel grid structure on the stress adjusting layer and forming a pad structure on the metallization layer and within the substrate.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a metallization layer on a front side surface of a substrate;
   depositing a high-k dielectric layer on a back side surface of the substrate;
   depositing a stress adjusting layer on the high-k dielectric layer, wherein depositing the stress adjusting layer comprises depositing a silicon-rich oxide layer with non-overlapping concentration profiles of silicon atoms and oxygen atoms;
   forming a pixel grid structure on the high-k dielectric layer; and
   forming a pad structure on the metallization layer and in the substrate.

2. The method of claim 1, wherein depositing the stress adjusting layer comprises depositing the silicon-rich oxide layer with a silicon concentration of about 45 atomic % to about 65 atomic %.

3. The method of claim 1, wherein depositing the stress adjusting layer comprises depositing the silicon-rich oxide layer with a silicon-to-oxygen concentration ratio of about 28:15 to about 28:31.

4. The method of claim 1, wherein depositing the stress adjusting layer comprises depositing the silicon-rich oxide layer with a silicon-to-oxygen concentration ratio profile having a decreasing slope from a bottom surface to a top surface of the silicon-rich oxide layer.

5. The method of claim 1, wherein depositing the stress adjusting layer further comprises depositing a silicon oxide layer on the silicon-rich oxide layer, and
   wherein silicon and oxygen concentrations of the silicon-rich oxide layer are higher than silicon and oxygen concentrations of the silicon oxide layer.

6. The method of claim 1, wherein forming the pixel grid structure comprises forming a metal grid structure or an oxide grid structure.

7. The method of claim 1, further comprising depositing a second stress adjusting layer on the pixel grid structure.

8. The method of claim 7, wherein a silicon-to-oxygen concentration ratio profile of the stress adjusting layer is different from a silicon-to-oxygen concentration ratio profile of the second stress adjusting layer.

9. A method, comprising:
   forming an interconnect structure on a first side surface of a substrate;
   depositing an anti-reflective coating (ARC) layer on a second side surface of the substrate;
   depositing an oxide layer on the ARC layer, wherein the oxide layer comprises an oxygen concentration profile that decreases from a bottom surface to a top surface of the oxide layer;
   forming a pixel grid structure on the oxide layer; and
   forming a pad structure on the interconnect structure.

10. The method of claim 9, wherein depositing the oxide layer comprises depositing a metal oxide layer with a metal-to-oxygen concentration ratio profile having a decreasing slope or an increasing slope from a bottom surface to a top surface of the metal oxide layer.

11. The method of claim 9, wherein depositing the oxide layer comprises depositing a metal oxide layer with a metal concentration profile having a step profile or a graded profile.

12. The method of claim 9, wherein depositing the oxide layer comprises depositing a semiconductor oxide layer with a semiconductor-to-oxygen concentration ratio profile having a decreasing slope or an increasing slope from a bottom surface to a top surface of the semiconductor oxide layer.

13. The method of claim 9, wherein depositing the oxide layer comprises depositing a semiconductor oxide layer with a semiconductor concentration profile having a step profile or a graded profile.

14. The method of claim 9, wherein depositing the oxide layer comprises depositing a silicon-rich oxide layer with a silicon concentration of about 45 atomic % to about 65 atomic %.

15. The method of claim 9, wherein forming the pixel grid structure comprises forming an oxide grid structure.

16. The method of claim 9, wherein forming the pixel grid structure comprises forming a metal grid structure.

17. A method, comprising:
   forming an interconnect structure on a first side surface of a substrate;
   depositing an anti-reflective coating (ARC) layer on a second side surface of the substrate;

forming a pad structure on the interconnect structure and through the ARC layer;

depositing a stress adjusting layer on the pad structure, wherein the stress adjusting layer comprises non-overlapping concentration profiles of semiconductor atoms and oxygen atoms; and forming an oxide grid structure on the stress adjusting layer.

18. The method of claim 17, wherein forming the pad structure comprises depositing a metal layer in contact with the interconnect structure, and wherein the stress adjusting layer is in contact with the metal layer.

19. The method of claim 17, wherein forming the oxide grid structure comprises:

depositing an oxide layer on the stress adjusting layer; and forming trenches in the oxide layer.

20. The method of claim 17, wherein depositing the stress adjusting layer comprises depositing a silicon-rich oxide layer with a silicon concentration of about 45 atomic % to about 65 atomic %.

* * * * *